United States Patent
Yang et al.

(10) Patent No.: US 11,538,417 B2
(45) Date of Patent: Dec. 27, 2022

(54) LIGHT EMISSION CONTROL SHIFT REGISTER AND METHOD THEREOF, GATE DRIVING CIRCUIT, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Yang, Beijing (CN); Chengchung Yang, Beijing (CN); Xiangfei He, Beijing (CN); Ling Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/512,208

(22) Filed: Oct. 27, 2021

(65) Prior Publication Data
US 2022/0284861 A1  Sep. 8, 2022

(30) Foreign Application Priority Data
Mar. 3, 2021  (CN) .......................... 202110237137.9

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G11C 19/28* (2013.01); *G09G 2300/0426* (2013.01); *G09G 2300/0819* (2013.01); *G09G 2310/0286* (2013.01); *G09G 2320/045* (2013.01)

(58) Field of Classification Search
CPC .............. G09G 3/3266; G09G 3/3233; G09G 2300/0426; G09G 2300/0819; G09G 2310/0286; G09G 2320/045; G11C 19/28
See application file for complete search history.

(56) References Cited

U.S. PATENT DOCUMENTS

2012/0081409 A1*  4/2012  Chung ................. G09G 3/3266
                                                    327/108

* cited by examiner

*Primary Examiner* — Stacy Khoo
(74) *Attorney, Agent, or Firm* — Dinsmore & Shohl LLP

(57) ABSTRACT

Embodiments of the present disclosure provide a light emission control shift register and method thereof, a gate driving circuit, and a display device. An input circuit outputs a signal of a signal input terminal to a first node. A first control circuit outputs a voltage of a first voltage terminal to a second node. A second control circuit transmits the voltage of the first voltage terminal to a third node. A third control circuit transmits the voltage of the first voltage terminal to a fourth node, and the third control circuit can further transmit the voltage of the second voltage terminal to the fourth node. A fourth control circuit transmits the voltage of the first voltage terminal to a signal output terminal, and the fourth control circuit can further transmit the voltage of the second voltage terminal to the signal output terminal.

20 Claims, 11 Drawing Sheets

P4

P5

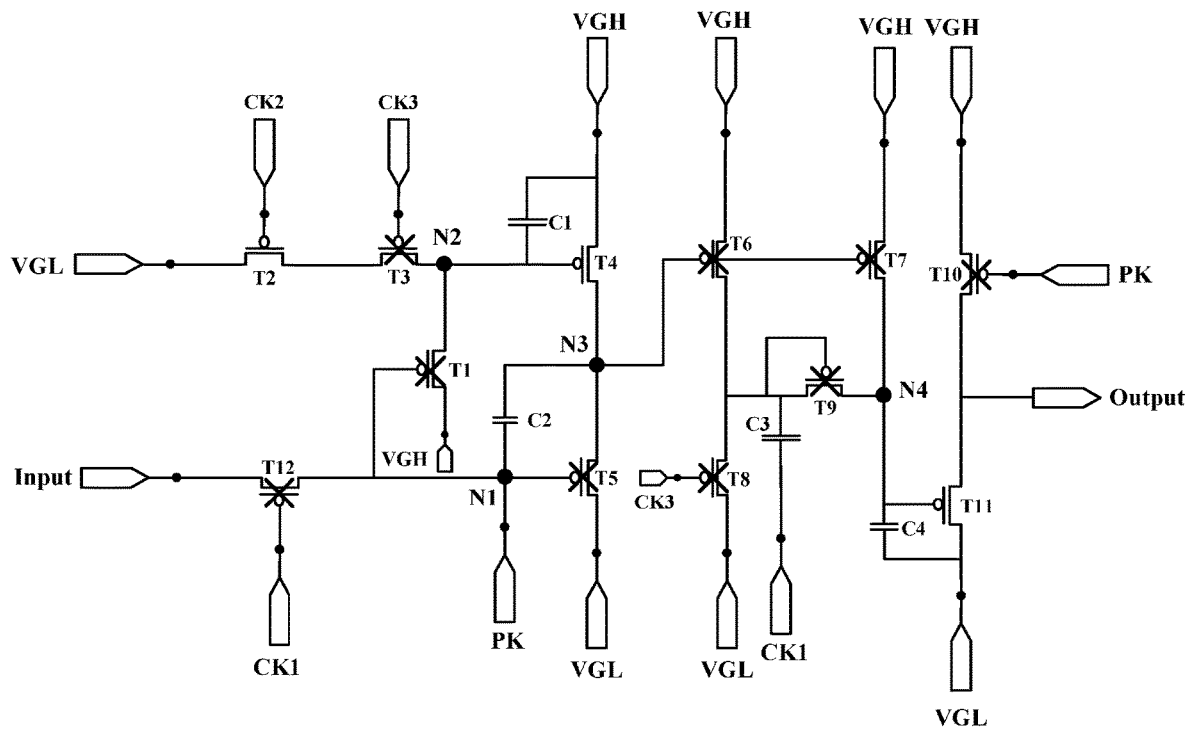

Fig. 12

| in a non-light emission stage, controlling, by the first control circuit, the signal of the second node to be an inactive signal, controlling, by the second control circuit, the signal of the third node to be an active signal, and controlling, by the third control circuit, the signal of the fourth node to be an inactive signal; controlling, by the fourth control circuit, the signal output terminal to output an inactive signal | 1301 |
|---|---|
| in a light emission stage, controlling, by the first control circuit, the signal of the second node to be an active signal, controlling, by the second control circuit, the signal of the third node to be an inactive signal, and controlling, by the third control circuit, the signal of the fourth node to be an active signal; controlling, by the fourth control circuit, the signal output terminal to output an active signal | 1302 |

Fig. 13

LIGHT EMISSION CONTROL SHIFT REGISTER AND METHOD THEREOF, GATE DRIVING CIRCUIT, AND DISPLAY DEVICE

CROSS REFERENCE TO RELATED APPLICATIONS

The present disclosure claims priority to application for invention No. 202110237137.9 filed to the China Intellectual Property Office on Mar. 3, 2021, the disclosure of which is hereby incorporated by reference in its entirety.

FIELD

The present disclosure relates to the field of display technology, and particularly to a light emission control shift register and method thereof, a gate driving circuit, and a display device.

BACKGROUND

GOA (Gate Driver On Array) circuitry is a technology for progressive scanning and driving of gating signal lines (Gate lines). Integrating a gate driving circuit on an array substrate of a display panel using GOA technology can reduce the production cost of the display panel and the difficulty of the manufacturing process. The gate driving circuit integrated on an array substrate using GOA technology is also called shift registers.

DISCLOSURE OF THE INVENTION

According to an aspect of the embodiments of the present disclosure, there is provide a light emission control shift register, comprising:

an input circuit electrically connected to a signal input terminal, a first clock signal terminal and a first node; wherein the input circuit is configured to output a signal of the signal input terminal to the first node under the control of a signal from the first clock signal terminal;

a first control circuit electrically connected to the first node, a second clock signal terminal, a third clock signal terminal, a first voltage terminal, a second voltage terminal and a second node; wherein the first control circuit is configured to output a voltage of the first voltage terminal to the second node under the control of a signal from the first node; the first control circuit is further configured to transmit a voltage of the second voltage terminal to the second node under the control of signals from the second clock signal terminal and the third clock signal terminal;

a second control circuit electrically connected to the first node, the second node, a third node, the first voltage terminal and the second voltage terminal; wherein the second control circuit is configured to transmit the voltage of the first voltage terminal to the third node under the control of a signal from the second node and the first voltage terminal; the second control circuit is further configured to transmit the voltage of the second voltage terminal to the third node under the control of the signal from the first node;

a third control circuit electrically connected to the third node, a fourth node, the first voltage terminal, the second voltage terminal, the first clock signal terminal and the third clock signal terminal; wherein the third control circuit is configured to transmit the voltage of the first voltage terminal to the fourth node under the control of a signal from the third node; the third control circuit is further configured to transmit the voltage of the second voltage terminal to the fourth node under the control of the signals from the first clock signal terminal and the third clock signal terminal;

a fourth control circuit electrically connected to the fourth node, the first node, the first voltage terminal, the second voltage terminal and a signal output terminal; wherein the fourth control circuit is configured to transmit the voltage of the first voltage terminal to the signal output terminal under the control of the signal from the first node; the fourth control circuit is further configured to transmit the voltage of the second voltage terminal to the signal output terminal under the control of the signal from the fourth node.

In some embodiments of the present disclosure, the first control circuit comprises:

a first pull-up circuit electrically connected to the first node, the second node and the first voltage terminal; wherein the first pull-up circuit is configured to transmit the voltage of the first voltage terminal to the second node under the control of the signal from the first node;

a first pull-down circuit electrically connected to the second clock signal terminal, the third clock signal terminal, the second voltage terminal and the second node; wherein the first pull-down circuit is configured to transmit the voltage of the second voltage terminal to the second node under the control of signals from the second clock signal terminal and the third clock signal terminal.

In some embodiments of the present disclosure, the first pull-up circuit comprises:

a first transistor, a first electrode of the first transistor being electrically connected to the first voltage terminal, a second electrode of the first transistor being electrically connected to the second node, and a gate of the first transistor being electrically connected to the first node.

In some embodiments of the present disclosure, the first pull-down circuit comprises:

a second transistor, a first electrode of the second transistor being electrically connected to the second voltage terminal, and a gate of the second transistor being electrically connected to the second clock signal terminal;

a third transistor, a first electrode of the third transistor being electrically connected to a second electrode of the second transistor, a second electrode of the third transistor being electrically connected to the second node, and a gate of the third transistor being electrically connected to the third clock signal terminal.

In some embodiments of the present disclosure, the second control circuit comprises:

a second pull-up circuit electrically connected to the second node, the third node and the first voltage terminal; wherein the second pull-up circuit is configured to transmit the voltage of the first voltage terminal to the third node under the control of a signal from the second node and the first voltage terminal;

a second pull-down circuit electrically connected to the first node, the third node and the second voltage terminal; wherein the second pull-down circuit is configured to transmit the voltage of the second voltage terminal to the third node under the control of a signal from the first node.

In some embodiments of the present disclosure, the second pull-up circuit comprises:

a fourth transistor, a first electrode of the fourth transistor being electrically connected to the first voltage terminal, a second electrode of the fourth transistor being electrically connected to the third node, and a gate of the fourth transistor being electrically connected to the second node;

a first capacitor, a first electrode of the first capacitor being electrically connected to the first voltage terminal, and a second electrode of the first capacitor being electrically connected to the second node.

In some embodiments of the present disclosure, the second pull-down circuit comprises:

a fifth transistor, a first electrode of the fifth transistor being electrically connected to the second voltage terminal, a second electrode of the fifth transistor being electrically connected to the third node, and a gate of the fifth transistor being electrically connected to the first node;

a second capacitor, a first electrode of the second capacitor being electrically connected to the first node, and a second electrode of the second capacitor being electrically connected to the third node.

In some embodiments of the present disclosure, the third control circuit comprises:

a third pull-up circuit electrically connected to the third node, the fourth node and the first voltage terminal; wherein the third pull-up circuit is configured to transmit the voltage of the first voltage terminal to the fourth node under the control of a signal from the third node;

a third pull-down circuit electrically connected to the fourth node, the second voltage terminal, the first clock signal terminal and the third clock signal terminal; wherein the third pull-down circuit is configured to transmit the voltage of the second voltage terminal to the fourth node under the control of the signals from the first clock signal terminal and the third clock signal terminal.

In some embodiments of the present disclosure, the third pull-up circuit comprises:

a sixth transistor, a first electrode of the sixth transistor being electrically connected to the first voltage terminal, and a gate of the sixth transistor being electrically connected to the third node;

a seventh transistor, a first electrode of the seventh transistor being electrically connected to the first voltage terminal, a second electrode of the seventh transistor being electrically connected to the fourth node, and a gate of the seventh transistor being electrically connected to the third node.

In some embodiments of the present disclosure, the third pull-down circuit comprises:

an eighth transistor, a first electrode of the eighth transistor being electrically connected to the second voltage terminal, a second electrode of the eighth transistor being electrically connected to the second electrode of the sixth transistor, and a gate of the eighth transistor being electrically connected to the third clock signal terminal;

a ninth transistor, a first electrode of the ninth transistor being electrically connected to the second electrode of the eighth transistor, and a second electrode of the ninth transistor being electrically connected to the fourth node;

a third capacitor, a first electrode of the third capacitor being electrically connected to the gate of the ninth transistor and the first electrode of the ninth transistor, and a second electrode of the third capacitor being electrically connected to the first clock signal terminal.

In some embodiments of the present disclosure, the fourth control circuit comprises:

a fourth pull-up circuit electrically connected to the first node, the first voltage terminal and the signal output terminal; wherein the fourth pull-up circuit is configured to transmit the voltage of the first voltage terminal to the signal output terminal under the control of the signal from the first node;

a fourth pull-down circuit electrically connected to the fourth node, the second voltage terminal and the signal output terminal; wherein the fourth pull-down circuit is configured to transmit the voltage of the second voltage terminal to the signal output terminal under the control of the signal from the fourth node.

In some embodiments of the present disclosure, the fourth pull-up circuit comprises:

a tenth transistor, a first electrode of the tenth transistor being electrically connected to the first voltage terminal, a second electrode of the tenth transistor being electrically connected to the signal output terminal, and a gate of the tenth transistor being electrically connected to the first node.

In some embodiments of the present disclosure, the fourth pull-down circuit comprises:

an eleventh transistor, a first electrode of the eleventh transistor being electrically connected to the second voltage terminal, a second electrode of the eleventh transistor being electrically connected to the signal output terminal, and a gate of the eleventh transistor being electrically connected to the fourth node;

a fourth capacitor, a first electrode of the fourth capacitor being electrically connected to the fourth node, and a second electrode of the fourth capacitor being electrically connected to the second voltage terminal.

In some embodiments of the present disclosure, the input circuit comprises:

a twelfth transistor, a first electrode of the twelfth transistor being electrically connected to the signal input terminal, a second electrode of the twelfth transistor being electrically connected to the first node, and a gate of the twelfth transistor being electrically connected to the first clock signal terminal.

In another aspect of the present disclosure, there is provided a gate driving circuit comprising a plurality of light emission control shift registers according to the present disclosure.

In a further aspect of the present disclosure, there is provided a display device, comprising:

a plurality of pixel circuits arranged in an array; wherein the pixel circuit has a light emission control terminal and a gating signal terminal;

a first gate driving circuit that is the gate driving circuit according to the present disclosure; wherein the signal output terminal of each light emission control shift register in the first gate driving circuit is electrically connected to the light emission control terminals of pixel circuits located in the same row;

a second gate driving circuit comprising a plurality of cascaded gating control shift registers, wherein an output terminal of each gating control shift register is electrically connected to gating signal terminals of pixel circuits located in the same row.

In some embodiments of the present disclosure, the display device further comprises a first system clock signal line and a second system clock signal line;

the gating control shift register further comprises a first gating clock signal terminal and a second gating clock signal terminal;

the first gating clock signal terminal and the first clock signal terminal of the light emission control shift register are both electrically connected to the first system clock signal line;

the second gating clock signal terminal and the second clock signal terminal of the light emission control shift register are both electrically connected to the second system clock signal line;

a signal input terminal of a first-level gating control shift register and a signal input terminal of a first-level light emission control shift register are both electrically connected to a start signal terminal.

In a still further aspect of the present disclosure, there is provided a method for driving the light emission control shift register according to the present disclosure, wherein a time period for displaying a frame of image includes a non-light emission stage and a light emission stage; and within the time period, the method comprises:

in the non-light emission stage, controlling, by the first control circuit, the signal of the second node to be an inactive signal, controlling, by the second control circuit, the signal of the third node to be an active signal, and controlling, by the third control circuit, the signal of the fourth node to be an inactive signal; controlling, by the fourth control circuit, the signal output terminal to output an inactive signal;

in the light emission stage, controlling, by the first control circuit, the signal of the second node to be an active signal, controlling, by the second control circuit, the signal of the third node to be an inactive signal, and controlling, by the third control circuit, the signal of the fourth node to be an active signal; controlling, by the fourth control circuit, the signal output terminal to output an active signal;

wherein the active signal is a signal that turns on a transistor when being electrically connected to the gate of the transistor, the inactive signal is a signal that turns off a transistor when being electrically connected to the gate of the transistor, the signal at the first voltage terminal being an inactive signal, and the signal at the second voltage terminal being an active signal.

In some embodiments of the present disclosure, the non-light emission stage comprises a first stage, a second stage and a third stage, wherein, in the first stage, the input circuit outputs the active signal of the signal input terminal to the first node under the control of an active signal from the first clock signal terminal; the first control circuit transmits the voltage of the first voltage terminal to the second node under the control of the signal from the first node; the second control circuit transmits the voltage of the second voltage terminal to the third node under the control of the signals from the first node and the second node; the third control circuit transmits the voltage of the first voltage terminal to the fourth node under the control of the signal from the third node; the fourth control circuit transmits the voltage of the first voltage terminal to the signal output terminal under the control of the signals from the fourth node and the first node, wherein the signal output terminal outputs an inactive signal;

in the second stage, the first node maintains the active signal of the first stage; the first control circuit transmits the voltage of the first voltage terminal to the second node under the control of the signal from the first node; the second control circuit transmits the voltage of the second voltage terminal to the third node under the control of the signals from the first node and the second node; the third control circuit transmits the voltage of the first voltage terminal to the fourth node under the control of the signal from the third node; the fourth control circuit transmits the voltage of the first voltage terminal to the signal output terminal under the control of the signals from the fourth node and the first node, wherein the signal output terminal outputs an inactive signal;

in the third stage, the input circuit outputs an inactive signal of the signal input terminal to the first node under the control of an active signal from the first clock signal terminal; the second node maintains the inactive signal of the second stage; the third node maintains the active signal of the second stage; the third control circuit transmits the voltage of the first voltage terminal to the fourth node under the control of the signal from the third node; the signal output terminal maintains the inactive signal of the second stage.

In some embodiments of the present disclosure, the light emission stage comprises a fourth stage, a fifth stage and a sixth stage, wherein, in the fourth stage, the signal of the first node is an inactive signal supplied by the signal input terminal; the first control circuit transmits an active voltage of the second voltage terminal to the second node under the control of active signals from the second clock signal terminal and the third clock signal terminal; the second control circuit transmits the voltage of the first voltage terminal to the third node under the control of the signal from the second node or the first voltage terminal; the third control circuit transmits the voltage of the second voltage terminal to the fourth node under the control of an inactive signal from the first clock signal terminal and an active signal from the third clock signal terminal; the fourth control circuit transmits the voltage of the second voltage terminal to the signal output terminal under the control of the signal from the fourth node; wherein the signal output terminal outputs an active signal;

in the fifth stage, the input circuit outputs the inactive signal of the signal input terminal to the first node under the control of an active signal from the first clock signal terminal; the second node maintains the active signal of the fourth stage; the second control circuit transmits the voltage of the first voltage terminal to the third node under the control of the signal from the second node; the third control circuit transmits the voltage of the second voltage terminal to the fourth node under the control of an active signal from the first clock signal terminal and an inactive signal from the third clock signal terminal; the fourth control circuit transmits the voltage of the second voltage terminal to the signal output terminal under the control of the signal from the fourth node; wherein the signal output terminal outputs an active signal;

in the sixth stage, the first node maintains an inactive signal of the fifth stage; the second node maintains an active signal of the fifth stage; the second control circuit transmits the voltage of the first voltage terminal to the third node under the control of the signal from the second node; the fourth node maintains the active signal of the fifth stage; the fourth control circuit transmits the active voltage of the second voltage terminal to the signal output terminal under the control of the signal from the fourth node; the signal output terminal outputs an active signal.

DESCRIPTION OF THE DRAWINGS

In order to more clearly explain the embodiments of the present invention or the technical solutions in the prior art, a brief introduction will be given below for the drawings required to be used in the description of the embodiments or the prior art. It is obvious that, the drawings illustrated as follows are merely some of the embodiments of the present disclosure. For a person skilled in the art, he or she may also acquire other drawings according to such drawings on the premise that no inventive effort is involved.

FIG. 12 is an equivalent circuit diagram of sixth-stage of the light emission control shift register shown in FIG. 5;

FIG. 13 is a flowchart of a method of driving a light emission control shift register according to some embodiments of the present disclosure.

DETAILED DESCRIPTION OF PREFERRED EMBODIMENTS

Figure 1:
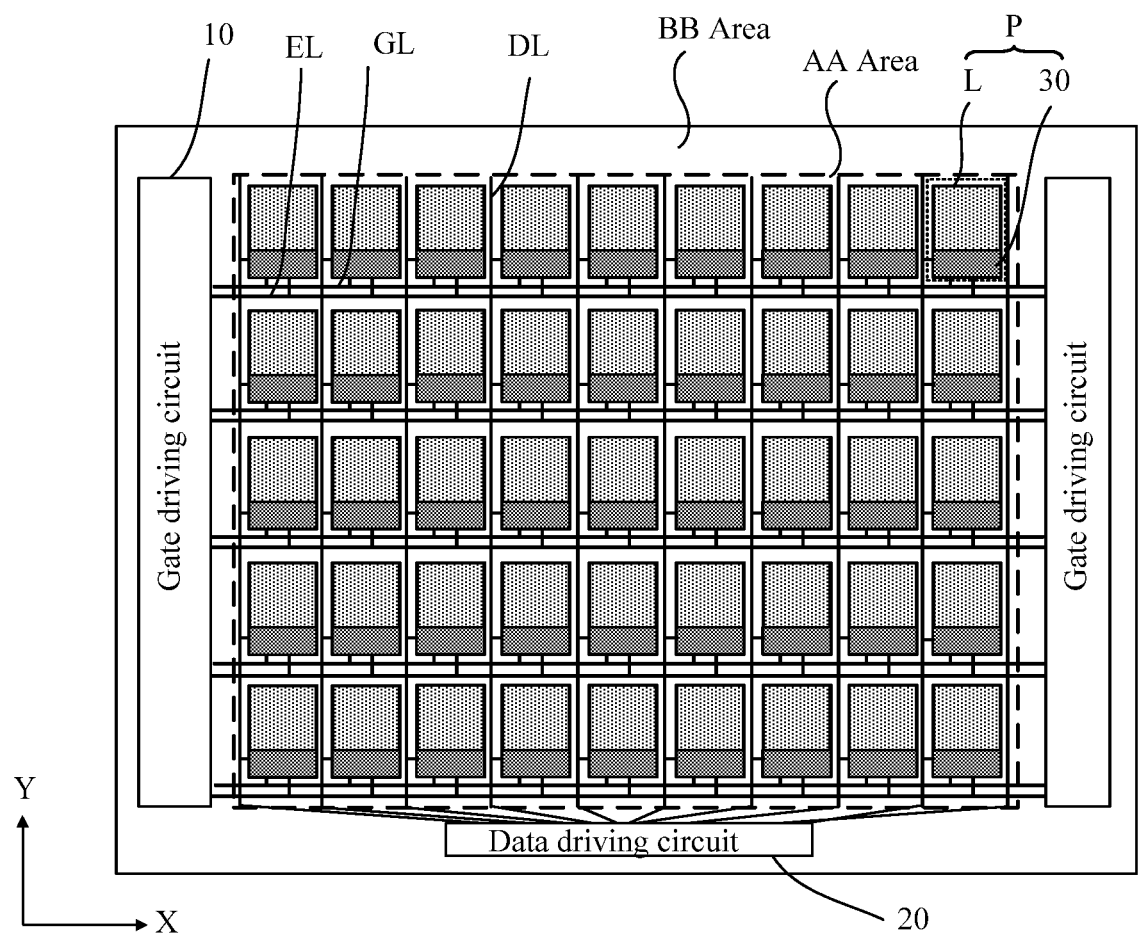
FIG. 1 is a structural diagram of a display device provided by an embodiment of the present disclosure.

Below, a clear and complete description will be given for the technical solution of embodiments of the present disclosure with reference to the figures of the embodiments. Obviously, merely some embodiments of the present disclosure, rather than all embodiments thereof, are given hereinin. All other embodiments obtained by those of ordinary skill in the art based on the embodiments of the present disclosure without creative efforts shall fall within the protection scope of the present disclosure.

Below, the terms "first" and "second" are used for descriptive purposes only, and are not to be construed as indicating or implying relative importance or implicitly indicating the number of indicated technical features. Thereby, features defined by "first" or "second" may expressly or implicitly include one or more of the features.

In addition, in the present disclosure, the directional terms such as "left", "right", "above" and "below" are defined relative to the schematic placement of the components in the drawings. It should be understood that these directional terms are relative concepts, and are used for description and clarification in a relative sense, which can change correspondingly according to the change in orientation of the components in the drawings.

In the present disclosure, the term "connection" should be interpreted broadly, unless otherwise specified and defined, for example, "connection" may be direct-contact connection, or non-contact connection through an intermediate medium.

An embodiment of the present disclosure provides a display device, which can be a television, a mobile phone, a computer, a notebook computer, a tablet computer, a personal digital assistant (PDA), an on-board computer, etc. The display device may include a frame, a display panel, a circuit board, an integrated circuit (IC) and other electronic accessories disposed within the frame.

The display device may be a self luminous display device, such as an organic light emitting diode (OLED) display device, a quantum dot light emitting diodes (QLED) display device, which is not specifically limited in the present disclosure.

As a current mode light-emitting device, OLED is more and more used in the field of high-performance display due to its self luminescence, fast response, wide viewing angle and the capability of fabrication on flexible substrates. The following embodiments of the present disclosure are explained by taking an OLED display device as an example.

As shown in FIG. 1, the display device 100 includes an active area (AA) and a peripheral area BB located on at least one side of the display area AA. In FIG. 1, the peripheral area BB is shown around the display area AA.

The display device 100 includes a plurality of sub-pixels P in the AA area. As shown in FIG. 1, each sub-pixel P is provided with a pixel circuit 30 and a light-emitting device L electrically connected to the pixel circuit 30, wherein the pixel circuit 30 can drive the light-emitting device L to emit light. In the case where the display device 100 is an OLED display device, the light emitting device L in the sub-pixel P may be an OLED. In this case, the OLED in the plurality of sub-pixels can emit light of at least three primary colors, such as red (R), green (G) and blue (B).

For convenience of explanation, the present disclosure will be described taking an example in which a plurality of sub-pixels P are arranged in a matrix form. In this case, sub-pixels P arranged in a row along the horizontal direction X are called sub-pixels in the same row, and sub-pixels P arranged in a column along the vertical direction Y are sub-pixels in the same column. As shown in FIG. 1, pixel circuits 30 of sub-pixels P located in the same row can be electrically connected to the same light emission control signal line (EM), and pixel circuits 30 of sub-pixels P located in the same row can also be electrically connected to the same gate line (GL). Pixel circuits 30 of sub-pixels P located in the same column can be electrically connected to the same data line (DL).

Referring to FIG. 1, it can be seen that the peripheral area BB of the above display device 100 can be provided with a gate driving circuit 10 and a data driving circuit 20. The gate driving circuit 10 may provide, for example, a gating signal for progressive scanning to the pixel circuits 30 in the sub-pixels P arranged in the array within the AA area through a plurality of gate lines GL. The gating signal is used to gate a pixel circuit 30 so that a data signal provided by the data driving circuit 20 can be input to the gated pixel circuit 30 through the above data signal line DL.

In addition, the gate driving circuit 10 can also provide, for example, a light emission signal EM for progressive scanning to the pixel circuits 30 in the sub-pixels P arranged in the array within the AA area through a plurality of light emission control signal lines EM. The light emission signal EM is used to control the pixel circuit 30 to output a driving current to the light-emitting device L electrically connected to the pixel circuit 30 to drive the light-emitting device L to emit light.

It should be noted that in some embodiments of the present disclosure, a gate driving circuit 10 can be disposed on one side of the peripheral area BB to drive respective gate lines GL row by row from one side, that is, single-sided driving. In other embodiments of the present disclosure, two gate driving circuits are arranged on both sides of the peripheral area BB along the extension direction of the gate lines GL, and the gate lines GL are driven row by row from both sides alternately through the two gate driving circuits, that is, cross driving. In other embodiments of the present disclosure, two gate driving circuits are arranged on both sides of the peripheral area BB along the extension direction of the gate lines GL, and the gate lines GL are driven row by row from both sides at the same time through the two gate driving circuits 10, that is, double-sided driving. The following embodiments of the present disclosure will be explained by taking double-sided driving as an example.

Figure 2:
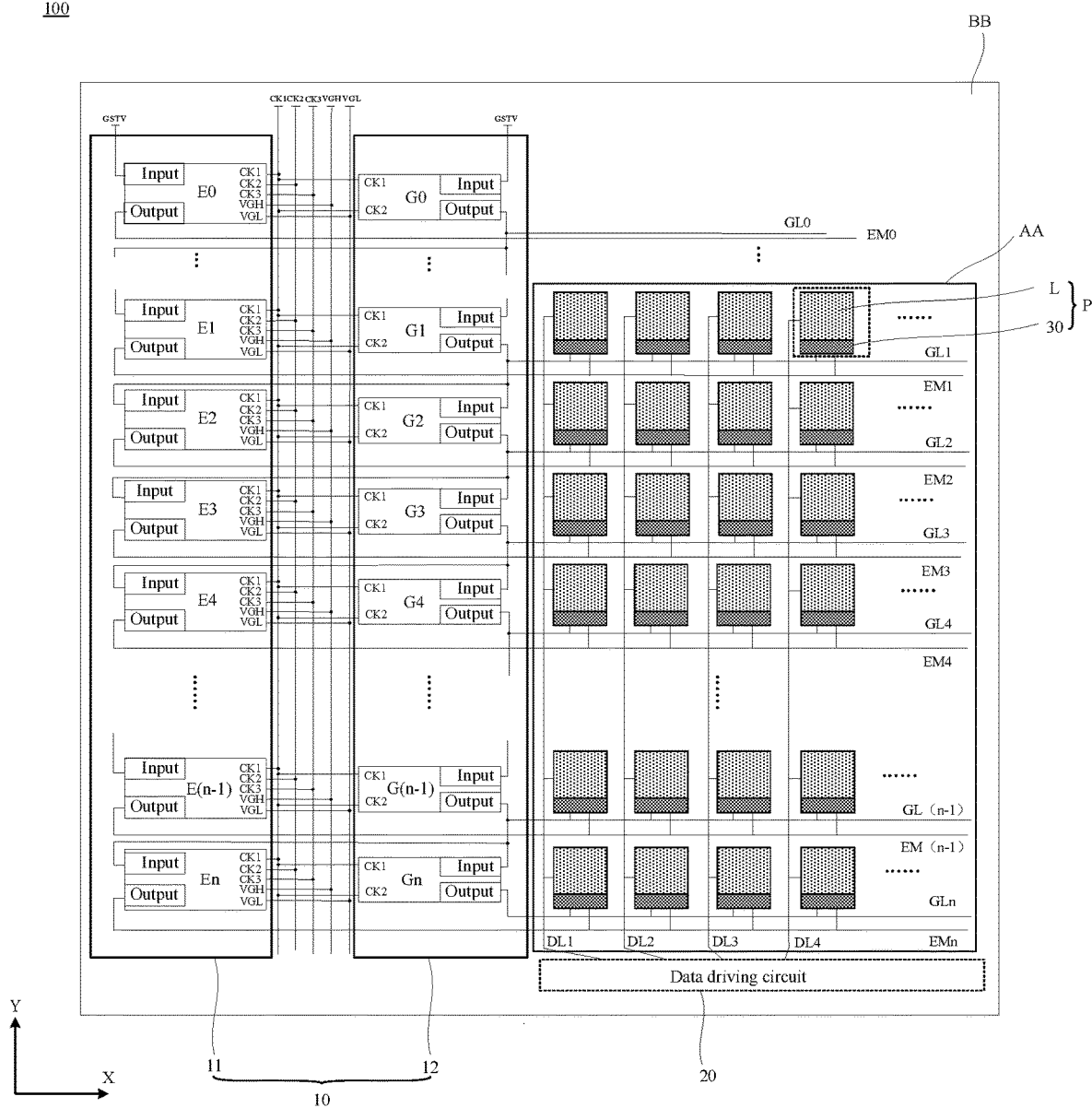
FIG. 2 is a specific structural diagram of the display device shown in FIG. 1.

In some embodiments of the present disclosure, in order to provide the above light emission signal EM and gating signal respectively to the pixel circuits 30 of the sub-pixels P arranged in the array within the AA area, as shown in FIG. 2, the gate driving circuit 10 may include a first gate driving circuit 11 and a second gate driving circuit 12. The first gate driving circuit 11 may provide a light emission signal EM to the pixel circuits 30, and the second gate driving circuit 12 may provide a gating signal to the pixel circuits 30.

It should be noted that, in order to simplify the drawing, FIG. 2 shows only the structure of the gate driving circuit 10 on one side, and the gate driving circuit 10 on the other side has a similar structure.

In some embodiments of the present disclosure, as shown in FIG. 2, the first gate driving circuit 11 may include a plurality of light emission control shift registers (Emission GOA, hereinafter referred to as EOA). For example, as shown in FIG. 2, the first gate driving circuit 11 may include, for example, a dummy EOA (for example, E0), and E1, E2, E3, E4 . . . E (n−1), En. The dummy EOA refers to an EOA shift register that is not electrically connected to the pixel circuits 30 in the sub-pixels P. Any one of E1, E2, E3, E4 . . . E (n−1), En can provide a light emission signal EM for the pixel circuits 30 in the sub-pixels P.

In addition, each EOA register may include a signal input terminal (Input) and a signal output terminal (Output). The signal input terminal Input of the first-level EOA register E0 is electrically connected to a start signal terminal GSTV and receives a start signal GSTV from the start signal terminal GSTV. Except for the first-level EOA register E0, the signal input terminal Input of each EOA register is electrically connected to the signal output terminal Output of an upper-level gating control shift register (Gate GOA, hereinafter referred to as GOA).

In addition, the signal output terminal Output of each EOA register other than the dummy EOA is electrically connected to a light emission control signal line EM. When the above start signal GSTV is an active signal, the first gate driving circuit 11 enters an operating state for shift register processing of the signal.

It should be noted that the connection of the plurality of EOA registers is not specifically limited in the embodiment of the present disclosure. The way of connecting the above plurality of EOA registers is only an example, and other connection ways than that illustrated above can also be used for the plurality of EOA registers in the embodiments of the present disclosure.

In addition, as shown in FIG. 2, the second gate driving circuit 12 includes a plurality of cascaded GOA registers, such as a dummy GOA (for example, G0) and G1, G2, G3, G4 . . . G (n−1), Gn, wherein the dummy GOA refers to a GOA shift register that is not electrically connected to the pixel circuits 30 in the sub-pixels P. Any one of G1, G2, G3, G4 . . . G (n−1) and Gn can provide a gating signal for the pixel circuits 30 in the sub-pixels P.

In addition, each GOA register may include a signal input terminal (Input) and a signal output terminal (Output). For example, the signal input terminal Input of the first-level GOA register G0 is electrically connected to the start signal terminal GSTV and receives the start signal GSTV from the start signal terminal GSTV. Except for the first-level GOA register G0, the signal output terminal Output of the GOA register is electrically connected to the signal input terminal Input of a next-level GOA register. In addition, the signal output terminal Output of each GOA register other than the dummy GOA in the second gate driving circuit 12 is also electrically connected to a gate line GL.

In some embodiments of the present disclosure, the start signal terminal GSTV electrically connected to the signal input terminal Input of register E0 can be also used as the start signal terminal GSTV electrically connected to the signal input terminal Input of register G0. In this way, by sharing the start signal of the start signal terminal GSTV between the signal input terminals Input of register E0 and register G0, the wiring layout of the EOA circuit is reduced, thereby reducing the wiring space of the display panel and facilitating a narrow frame design of the display device 100.

In addition, in some embodiments of the present disclosure, as shown in FIG. 2, the display device 100 further includes a first system clock signal line CK1 and a second system clock signal line CK2. The first system clock signal line CK1 is used to transmit a first clock signal CK1, and the second system clock signal line CK2 is used to transmit a second clock signal CK2.

In some embodiments of the present disclosure, each EOA register (e.g., E1) may further include a first clock signal terminal CK1, a second clock signal terminal CK2, a third clock signal terminal CK3, a first voltage terminal VGH, and a second voltage terminal VGL. The first clock signal terminal CK1 can be electrically connected to the first system clock signal line CK1, and the second clock signal terminal CK2 can be electrically connected to the second system clock signal line CK2. In the EOA register circuit, the first clock signal terminal CK1 can receive a first clock signal CK1, the second clock signal terminal CK2 can receive a second clock signal CK2, the third clock signal terminal CK3 can receive a third clock signal CK3, the first voltage terminal VGH can receive a first voltage VGH, and the second voltage terminal VGL can receive a second voltage VGL.

In this way, the EOA register outputs a light emission signal EM under the common control of first clock signal CK1, second clock signal CK2, third clock signal CK3, first voltage VGH and second voltage VGL, and outputs the light emission signal EM from the signal output terminal Output of the EOA register.

In addition, each GOA register (e.g., G1) may further include a first clock signal terminal CK1 and a second clock signal terminal CK2 in order to output the above gating signal. The first clock signal terminal CK1 can be electrically connected to the first system clock signal line CK1, and the second clock signal terminal CK2 can be electrically connected to the second system clock signal line CK2, to receive the first clock signal CK1 and second clock signal CK2 respectively. In this way, the GOA register can output the gating signal from the signal output terminal Output of the GOA register under the control of the first clock signal CK1 and the second clock signal CK2.

To sum up, the first clock signal terminal CK1 and the second clock signal terminal CK2 of the EOA register share the first system clock signal line CK1 and the second system clock signal line CK2 with the first clock signal terminal CK1 and the second clock signal terminal CK2 of the GOA register. Therefore, the number of signal wirings of the gate driving circuit 10 can be reduced, thereby reducing the wiring space of the display panel and facilitating a narrow frame design of the display device 100.

As can be seen from the above, as shown in FIG. 2, each sub-pixel P may include a pixel circuit 30 and a light-emitting device L. The circuit structure of the pixel circuit 30 may be, for example, 7T1C, 7T2C, 8T2C or 4T1C commonly used in the art. The light emitting device L may be, for example, an OLED. The pixel circuit 30 can drive the light-emitting device L to emit light under the joint action of a data signal transmitted by the data line DL, the gating signal transmitted by the gate line GL, and the light emission signal EM transmitted by the light emission control signal line EM, so as to realize display and other operations.

Figure 3A:
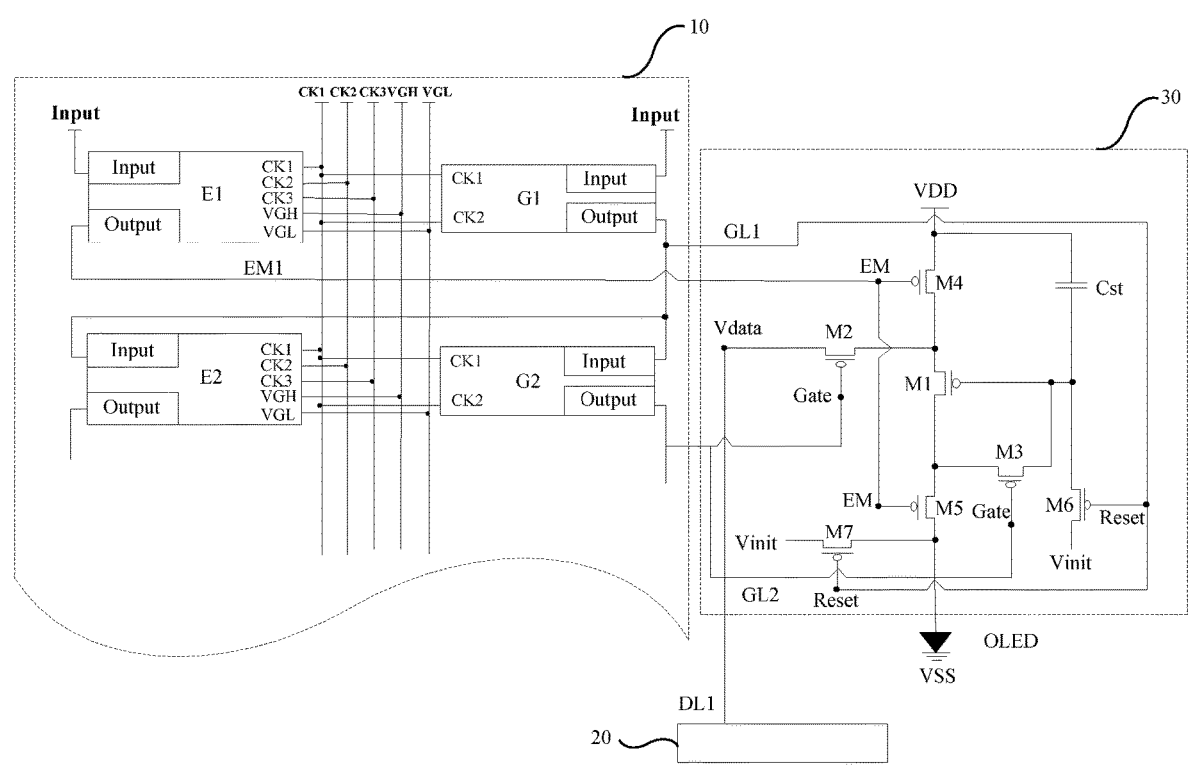
FIG. 3A is a partial structural diagram of the display device shown in FIG. 2.

For convenience of explanation, the following embodiments of the present disclosure take the circuit structure of the pixel circuit 30 including 7T1C shown in FIG. 3A (FIG. 3A is diagram showing a partial structure of FIG. 2) as an example. In order to receive the data signal, the gating signal and the light emission signal EM, as shown in FIG. 3A, the pixel circuit 30 is provided with a data signal terminal Vdata, a gating signal terminal Gate, a reset terminal Reset and a light emission control terminal EM. The data signal terminal Vdata transmits the data signal, the gating signal terminal Gate and the reset terminal Reset transmit the gating signal, and the light emission control terminal EM transmits the light emission signal EM. It should be noted that in order to simplify the drawing, the dummy EOA and the dummy GOA in FIG. 2 are not shown in FIG. 3.

Figure 3B:
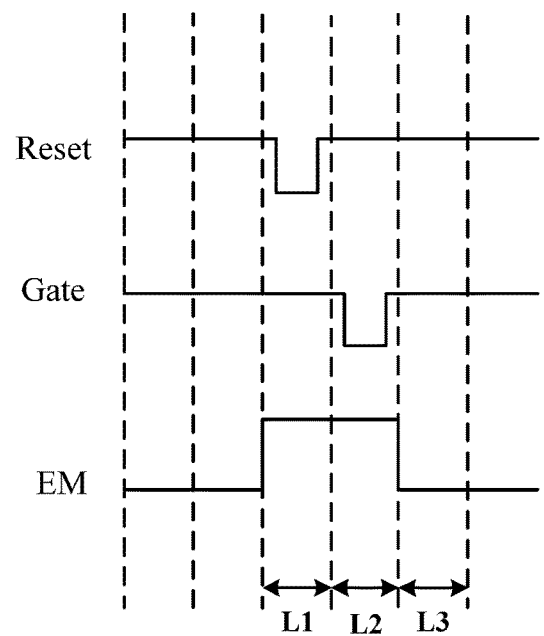
FIG. 3B is a timing diagram of the pixel circuit shown in FIG. 3A.

How the pixel circuit 30 shown in FIG. 3A drives the light-emitting device L to emit light will be explained below with reference to the timing signals shown in FIG. 3B. In the case where each transistor shown in FIG. 3A is a P-type transistor, each signal shown in FIG. 3B is in an active state when it is at a low level. In the description of the present disclosure, the active signal refers to a signal that turns on a transistor when being electrically connected to the gate of the transistor, and the inactive signal is a signal that turns off a transistor when being electrically connected to the gate of the transistor. For example, if the transistor is a P-type transistor, the active signal is a low-level signal and the inactive signal is a high-level signal. If the transistor is an N-type transistor, the active signal is a high-level signal and the inactive signal is a low-level signal.

The process of driving the light-emitting device L to emit light by the pixel circuit 30 may include a reset stage L1, a data writing stage L2 and a light emission stage L3 as shown in FIG. 3B. In the reset stage L1, a low-level signal is input to the reset terminal Reset. At this point, the reset transistors M6 and M7 are turned on, and an initial signal Vinit is transmitted to the gate of the driving transistor M1 and the anode of the OLED device to initially reset the gate of the driving transistor M1 and the anode of the OLED device. In the data writing stage L2, a low-level gating signal is input to the gating signal terminal Gate. At this point, the data writing transistor M2 is turned on, and a data signal Vdata is written to an electrode of the driving transistor M1 through the data signal terminal Vdata. At this point, the compensation transistor M3 is turned on, and the driving transistor M1 is in a diode-turn-on state to compensate the threshold voltage Vth of the driving transistor M1. In the light emission stage L3, a low-level light emission signal EM is input to the light emission control terminal EM. At this point, the light emission control transistors M4 and M5 are turned on, and a current path is formed between VDD and VSS, so that a current generated by the driving transistor M1 can flow into the light-emitting device L to drive the light-emitting device to emit light.

In addition, if the light-emitting device L is an OLED, since the OLED is a current-type light-emitting device, the magnitude of the current flowing through the OLED can be controlled by controlling the data signal Vdata, so as to achieve the purpose of controlling the luminance of the OLED. To sum up, the pixel circuit 30 can drive the light-emitting element L to emit light under the joint action of the light emission signal EM, the gating signal and the data signal Vdata.

Figure 4:
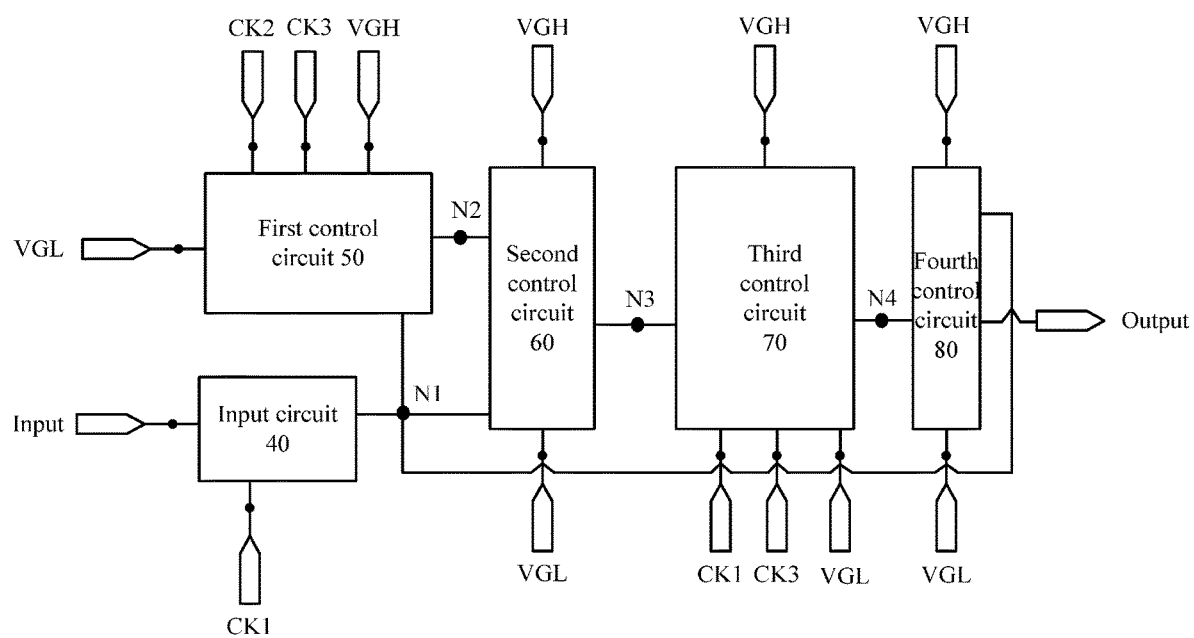
FIG. 4 is a schematic circuit structure diagram of a light emission control shift register provided by an embodiment of the present disclosure.

In order to provide the above light emission signal EM to the pixel circuit 30, in some embodiments of the present disclosure, as shown in FIG. 4, a circuit structure diagram of an EOA register is provided. The EOA register may include an input circuit 40, a first control circuit 50, a second control circuit 60, a third control circuit 70, and a fourth control circuit 80.

Specifically, the input circuit 40 is electrically connected to the signal input terminal Input, the first clock signal terminal CK1 and the first node N1. The input circuit 40 is configured to output a signal of the signal input terminal Input to the first node N1 under the control of a signal from the first clock signal terminal CK1.

The first control circuit 50 is electrically connected to the first node N1, the second clock signal terminal CK2, the third clock signal CK3, the first voltage terminal VGH, the second voltage terminal VGL and the second node N2. The first control circuit 50 is configured to output a voltage of the first voltage terminal VGH to the second node N2 under the control of a signal from the first node N1. In addition, the first control circuit 50 is further configured to transmit a voltage of the second voltage terminal VGL to the second node N2 under the control from the second clock signal terminal CK2 and the third clock signal CK3.

The second control circuit 60 is electrically connected to the first node N1, the second node N2, the third node N3, the first voltage terminal VGH and the second voltage terminal VGL. The second control circuit 60 is configured to transmit a voltage of the first voltage terminal VGH to the third node N3 under the control of a signal from the second node N2 and the first voltage terminal VGH. In addition, the second control circuit 60 is further configured to transmit a voltage of the second voltage terminal VGL to the third node N3 under the control of a signal from the first node N1.

The third control circuit 70 is electrically connected to the third node N3, the fourth node N4, the first voltage terminal VGH, the second voltage terminal VGL, the first clock signal terminal CK1 and the third clock signal CK3. The third control circuit 70 is configured to transmit a voltage of the first voltage terminal VGH to the fourth node N4 under the control of a signal from the third node N3. In addition, the third control circuit 70 is further configured to transmit a voltage of the second voltage terminal VGL to the fourth node N4 under the control of signals from the first clock signal terminal CK1 and the third clock signal CK3.

The fourth control circuit 80 is electrically connected to the fourth node N4, the first node N1, the first voltage terminal VGH, the second voltage terminal VGL and the signal output terminal Output. The fourth control circuit 80 is configured to transmit a voltage of the first voltage terminal VGH to the signal output terminal Output under the control of a signal from the first node N1. In addition, the fourth control circuit 80 is further configured to transmit a voltage of the second voltage terminal VGL to the signal output terminal Output under the control of a signal from the fourth node N4.

It should be noted that the signal of the signal input terminal Input can be a signal output from the signal output terminal Output of an EOA register. Alternatively, if the EOA register is E0, the signal of the signal input terminal Input can also be the start signal GSTV. The high-voltage signal and the low-voltage signal are signals relative to the ground terminal, that is, the potential of the high-voltage signal is higher than the ground terminal, and the potential of the low-voltage signal is lower than the ground terminal.

To sum up, on the one hand, through the circuit structure of the EOA register provided above, a light emission signal EM can be provided to the pixel circuit 30. Specifically, each EOA register outputs a light emission signal EM from the signal output terminal Output under the joint action of the input circuit 40, the first control circuit 50, the second control circuit 60, the third control circuit 70 and the fourth control circuit 80. The light emission signal EM can be a first voltage VGH or a second voltage VGL. For example, if the light emission signal EM is the second voltage VGL (the second voltage VGL is an active voltage), the pixel circuit 30 may output a driving current to the light-emitting device L electrically connected to the pixel circuit 30 to drive the light-emitting device L to emit light. On the other hand, since the GOA register and the EOA register share the first system clock signal line CK1 and the second system clock signal line CK2, and share the start signal terminal GSTV, the number of signal wirings in the gate driving circuit 10 can be significantly reduced, thereby reducing the wiring layout space of the display panel and facilitating a narrow frame design of the display device 100.

FIG. 13 is a flowchart of a method of driving a light emission control shift register according to an embodiment of the present disclosure.

As shown in FIG. 13, the method comprises the following steps:

Step 1301: in a non-light emission stage, controlling, by the first control circuit, the signal of the second node to be an inactive signal, controlling, by the second control circuit, the signal of the third node to be an active signal, and controlling, by the third control circuit, the signal of the fourth node to be an inactive signal; controlling, by the fourth control circuit, the signal output terminal to output an inactive signal;

Step 1302: in a light emission stage, controlling, by the first control circuit, the signal of the second node to be an active signal, controlling, by the second control circuit, the signal of the third node to be an inactive signal, and controlling, by the third control circuit, the signal of the fourth node to be an active signal; controlling, by the fourth control circuit, the signal output terminal to output an active signal.

Next, the specific structures of the input circuit 40, the first control circuit 50, the second control circuit 60, the third control circuit 70 and the fourth control circuit 80 will be described in detail.

Figure 5:
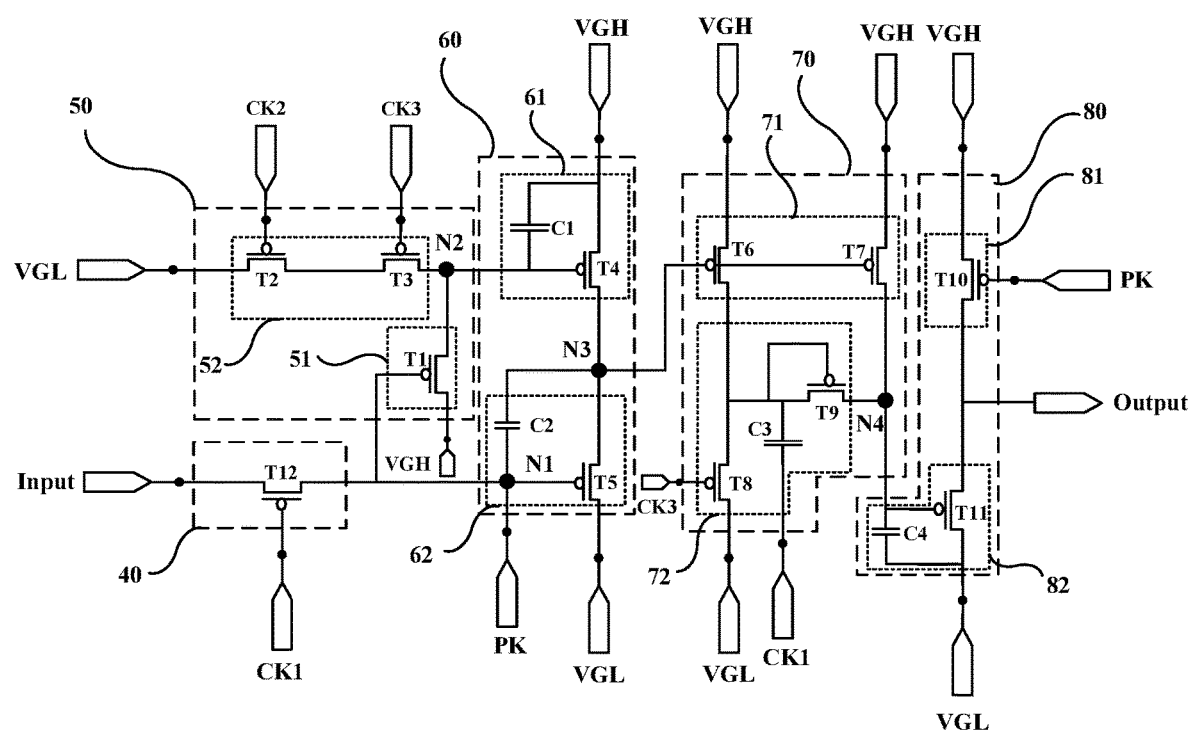
FIG. 5 is a schematic diagram of the specific circuit structure of the light emission control shift register shown in FIG. 4.

In some embodiments of the present disclosure, as shown in FIG. 5, the first control circuit 50 includes a first pull-up circuit 51 and a first pull-down circuit 52 connected to the first pull-up circuit 51.

Specifically, the first pull-up circuit 51 is electrically connected to the first node N1, the second node N2, and the first voltage terminal VGH. The first pull-up circuit 51 is configured to transmit a voltage of the first voltage terminal VGH to the second node N2 under the control of a signal from the first node N1. For example, referring to FIG. 5, the first pull-up circuit 51 may include a first transistor T1. A first electrode of the first transistor T1 is electrically connected to the first voltage terminal VGH, a second electrode of the first transistor T1 is electrically connected to the second node N2, and a gate of the first transistor T1 is electrically connected to the first node N1.

The first pull-down circuit 52 is electrically connected to the second clock signal terminal CK2, the third clock signal terminal CK3, the second voltage terminal VGL and the second node N2. The first pull-down circuit 52 is configured to transmit a voltage of the second voltage terminal VGL to the second node N2 under the control from the second clock signal terminal CK2 and the third clock signal terminal CK3. For example, as shown in FIG. 5, the first pull-down circuit 52 may include a second transistor T2 and a third transistor T3. A first electrode of the second transistor T2 is electrically connected to the second voltage terminal VGL, and a gate of the second transistor T2 is electrically connected to the second clock signal terminal CK2. A first electrode of the third transistor T3 is electrically connected to the second electrode of the second transistor T2, a second electrode of the third transistor T3 is electrically connected to the second node N2, and a gate of the third transistor T3 is electrically connected to the third clock signal terminal CK3.

In some embodiments of the present disclosure, as shown in FIG. 5, the second control circuit 60 may include a second pull-up circuit 61 and a second pull-down circuit 62 connected to the second pull-up circuit 61.

Specifically, the second pull-up circuit 61 is electrically connected to the second node N2, the third node N3, and the first voltage terminal VGH. The second pull-up circuit 61 is configured to transmit a voltage of the first voltage terminal VGH to the third node N3 under the control of a signal from the second node N2 and the first voltage terminal VGH. For example, as shown in FIG. 5, the second pull-up circuit 61 may include a fourth transistor T4 and a first capacitor C1. A first electrode of the fourth transistor T4 is electrically connected to the first voltage terminal VGH, a second electrode of the fourth transistor T4 is electrically connected to the third node N3, and a gate of the fourth transistor T4 is electrically connected to the second node N2. A first electrode of the first capacitor C1 is electrically connected to the first voltage terminal VGH, and a second electrode of the first capacitor C1 is electrically connected to the second node N2.

The second pull-down circuit 62 is electrically connected to the first node N1, the third node N3, and the second voltage terminal VGL. The second pull-down circuit 62 is configured to transmit a voltage of the second voltage terminal VGL to the third node N3 under the control of the signal from the first node N1. For example, as shown in FIG. 5, the second pull-down circuit 62 may include a fifth transistor T5 and a second capacitor C2. A first electrode of the fifth transistor T5 is electrically connected to the second voltage terminal VGL, a second electrode of the fifth transistor T5 is electrically connected to the third node N3, and a gate of the fifth transistor T5 is electrically connected to the first node N1. A first electrode of the second capacitor C2 is electrically connected to the first node N1, and a second electrode of the second capacitor C2 is electrically connected to the third node N3.

In some embodiments of the present disclosure, as shown in FIG. 5, the third control circuit 70 may include a third pull-up circuit 71 and a third pull-down circuit 72.

Specifically, the third pull-up circuit 71 is electrically connected to the third node N3, the fourth node N4 and the first voltage terminal VGH. The third pull-up circuit 71 is configured to transmit a voltage of the first voltage terminal VGH to the fourth node N4 under the control of a signal from the third node N3. For example, as shown in FIG. 5, the third pull-up circuit 71 may include a sixth transistor T6 and a seventh transistor T7. A first electrode of the sixth transistor T6 is electrically connected to the first voltage terminal VGH, and a gate of the sixth transistor T6 is electrically connected to the third node N3. A first electrode of the seventh transistor T7 is electrically connected to the first voltage terminal VGH, a second electrode of the seventh transistor T7 is electrically connected to the fourth node N4, and a gate of the seventh transistor T7 is electrically connected to the third node N3.

The third pull-down circuit 72 is electrically connected to the fourth node N4, the second voltage terminal VGL, the first clock signal terminal CK1 and the third clock signal terminal CK3. The third pull-down circuit 72 is configured to transmit a voltage of the second voltage terminal VGL to the fourth node N4 under the control of signals from the first clock signal terminal CK1 and the third clock signal terminal CK3. For example, as shown in FIG. 5, the third pull-down circuit 72 may include an eighth transistor T8, a ninth transistor T9, and a third capacitor C3. A first electrode of the eighth transistor T8 is electrically connected to the second voltage terminal VGL, a second electrode of the eighth transistor T8 is electrically connected to the second electrode of the sixth transistor T6, and a gate of the eighth transistor T8 is electrically connected to the third clock signal terminal CK3. A first electrode of the ninth transistor T9 is electrically connected to the second electrode of the eighth transistor T8, and a second electrode of the ninth transistor T9 is electrically connected to the fourth node N4. A first electrode of the third capacitor C3 is electrically connected to the gate of the ninth transistor T9 and the first electrode of the ninth transistor T9, and a second electrode of the third capacitor C3 is electrically connected to the first clock signal terminal CK1.

In some embodiments of the present disclosure, the fourth control circuit 80 may include a fourth pull-up circuit 81 and a fourth pull-down circuit 82. Specifically, the fourth pull-up circuit 81 is electrically connected to the first node N1, the first voltage terminal VGH, and the signal output terminal Output. The fourth pull-up circuit 81 is configured to transmit a voltage of the first voltage terminal VGH to the signal output terminal Output under the control of a signal from the first node N1. For example, as shown in FIG. 5, the fourth pull-up circuit 81 may include a tenth transistor T10. A first electrode of the tenth transistor T10 is electrically connected to the first voltage terminal VGH, a second electrode of the tenth transistor T10 is electrically connected to the signal output terminal Output, and a gate of the tenth transistor T10 is electrically connected to the first node N1.

The fourth pull-down circuit 82 is electrically connected to the fourth node N4, the second voltage terminal VGL and the signal output terminal Output. The fourth pull-down circuit 82 is configured to transmit a voltage of the second voltage terminal VGL to the signal output terminal Output under the control of a signal from the fourth node N4. For example, as shown in FIG. 5, the fourth pull-down circuit 82 includes an eleventh transistor T11 and a fourth capacitor C4. A first electrode of the eleventh transistor T11 is electrically connected to the second voltage terminal VGL, a second electrode of the eleventh transistor T11 is electrically connected to the signal output terminal Output, and a gate of the eleventh transistor T11 is electrically connected to the fourth node N4. A first electrode of the fourth capacitor C4 is electrically connected to the fourth node N4, and a second electrode of the fourth capacitor C4 is electrically connected to the second voltage terminal VGL.

In addition, in some embodiments of the present disclosure, as shown in FIG. 5, the input circuit 40 may include a twelfth transistor T12. A first electrode of the twelfth transistor T12 is electrically connected to the signal input terminal Input, a second electrode of the twelfth transistor T12 is electrically connected to the first node N1, and a gate of the twelfth transistor T12 is electrically connected to the first clock signal terminal CK1.

It should be noted that the transistors used in the EOA register provided by the embodiment of the present disclosure can be thin film transistors (TFTs), metal oxide semiconductors (MOS) or other switching transistors with the same characteristics. The embodiment of the present disclosure takes MOS transistors as an example.

In addition, the type of the transistors is not limited in the embodiment of the present disclosure. The transistors can be N-type transistors or P-type transistors. The transistors can be enhancement transistors or depletion transistors.

In the embodiment of the present disclosure, in order to distinguish the two electrodes of a transistor other than the gate, one electrode of the transistor is directly referred to as a first electrode and the other electrode is referred to as a second electrode. In this case, the first electrode of the transistor may be one of the source (S) and drain (D) of the transistor, and the second electrode may be the other of the source (S) and drain (D) of the transistor. Since the source S and drain D of the transistor can be symmetrical in structure, there can be no difference in structure between the source S and drain D.

In addition, the capacitors in the embodiment of the present invention (such as the first capacitor C1, the second capacitor C2, the third capacitor C3 and the fourth capacitor C4 in FIG. 5) can be capacitor devices made separately through a fabrication process. For example, a capacitor device can be realized by making specific capacitor electrodes. Each capacitor electrode of the capacitor can be realized by a metal layer, a semiconductor layer (for example, doped polysilicon), etc. The capacitors can also be the parasitic capacitors between transistors, or realized by the transistors themselves, other devices and wires, or realized by using parasitic capacitors between circuit wires.

In addition, it should be noted that each of the above transistors can further include at least one switch connected in parallel with the transistor. The above is only an example of the pixel circuit. Other structures with the same function as the above pixel circuit will not be described in detail, which however should all belong to the protection scope of the present disclosure.

Figure 6A:
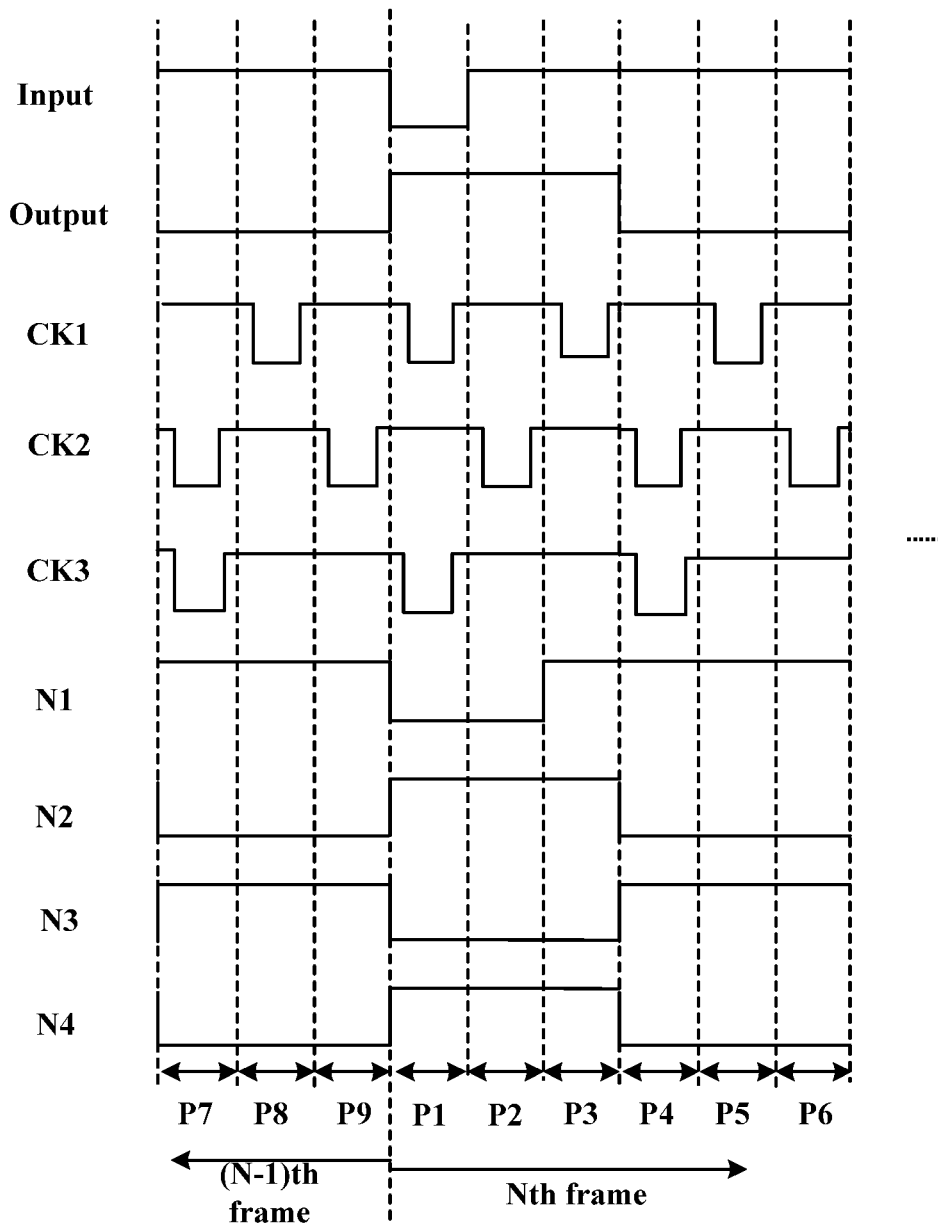
FIG. 6A is a timing diagram corresponding to the light emission control shift register shown in FIG. 5.
Figure 6B:
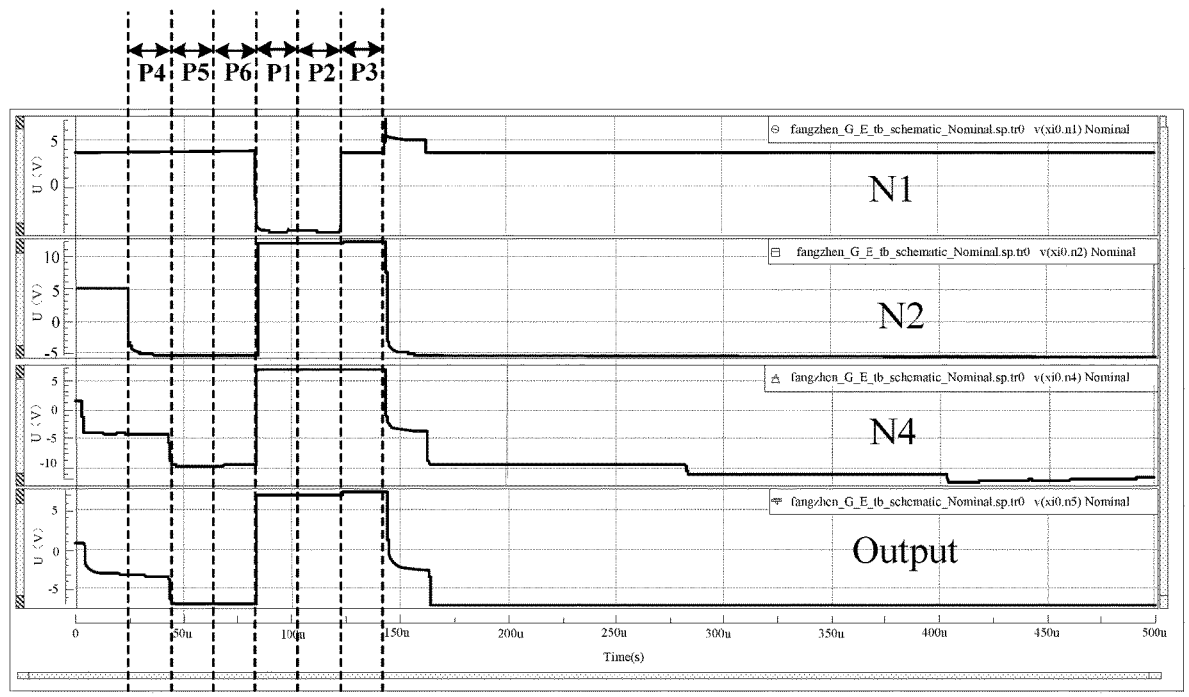
FIG. 6B is a simulation effect diagram of the light emission control shift register shown in FIG. 5 to which the timing diagram shown in FIG. 6A is applied.
Figure 6C:
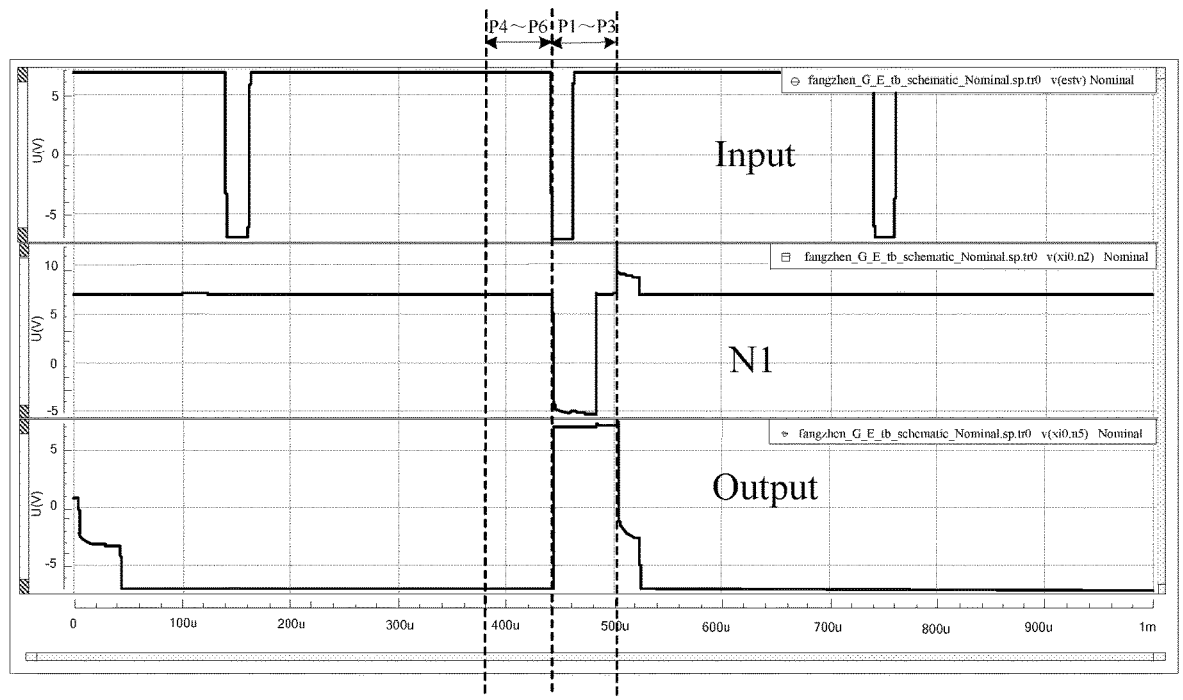
FIG. 6C is a simulation effect diagram of the light emission control shift register shown in FIG. 5 to which the timing diagram shown in FIG. 6A is applied.

In some embodiments of the present disclosure, a driving method as shown in FIG. 6A is provided based on the above circuit structure of the EOA register. In order to verify the technical effect of the EOA register circuit provided by the embodiment of the present disclosure using the driving method shown in FIG. 6A, the inventors conducted a simulation experiment. The experimental verification result is shown in FIG. 6B and FIG. 6C, in which signal waveforms of the nodes (N1 to N4) of the EOA register circuit shown in FIG. 5 and an output result of the Output terminal are obtained, showing that the signal waveform output by the EOA register circuit provided by the embodiment of the present disclosure is effective and correct.

The ON-OFF conditions of each transistor of the EOA circuit at different stages (P1 to P6) in the period of displaying one frame image are described in detail below with reference to FIG. 5 and FIG. 6A.

The embodiment of the present disclosure is described with an example in which the first voltage terminal VGH constantly outputs a high voltage, and the second voltage terminal VGL constantly outputs a low voltage. In addition, various transistors in the EOA circuit are P-type transistors (regardless of the influence of the threshold voltage of the transistor) as an example. In the case that the various transistors are P-type transistors, the P-type transistors turn on at a low voltage and turn off at a high voltage. Therefore, a low-voltage signal is an active signal and a high-voltage signal is an inactive signal.

The time period for displaying one frame image by the display device 100 may include a non-light emission stage and a light emission stage. The following embodiments of the present disclosure will be explained by taking the Nth image frame shown in FIG. 6A as an example. Wherein, the non-light emission stage of the Nth image frame may include a first stage P1, a second stage P2 and a third stage P3. In the non-light emission stage, as shown in FIG. 6A, the first control circuit 50 can control the signal of the second node N2 to be a high-voltage signal. The second control circuit 60 can control the signal of the third node N3 to be a low-voltage signal. The third control circuit 70 can control the signal of the fourth node N4 to be a high-voltage signal. The fourth control circuit 80 can control the signal output terminal Output to output a high-voltage signal. The ON-OFF conditions of the various transistors in the EOA circuit in the non-light emission stage (P1, P2 and P3) will be described in detail below.

In the first stage P1, Input=0, Output=1, CLK1=0, CLK2=1, CLK3=0. Where, "0" indicates a low voltage and "1" indicates a high voltage.

Figure 7:
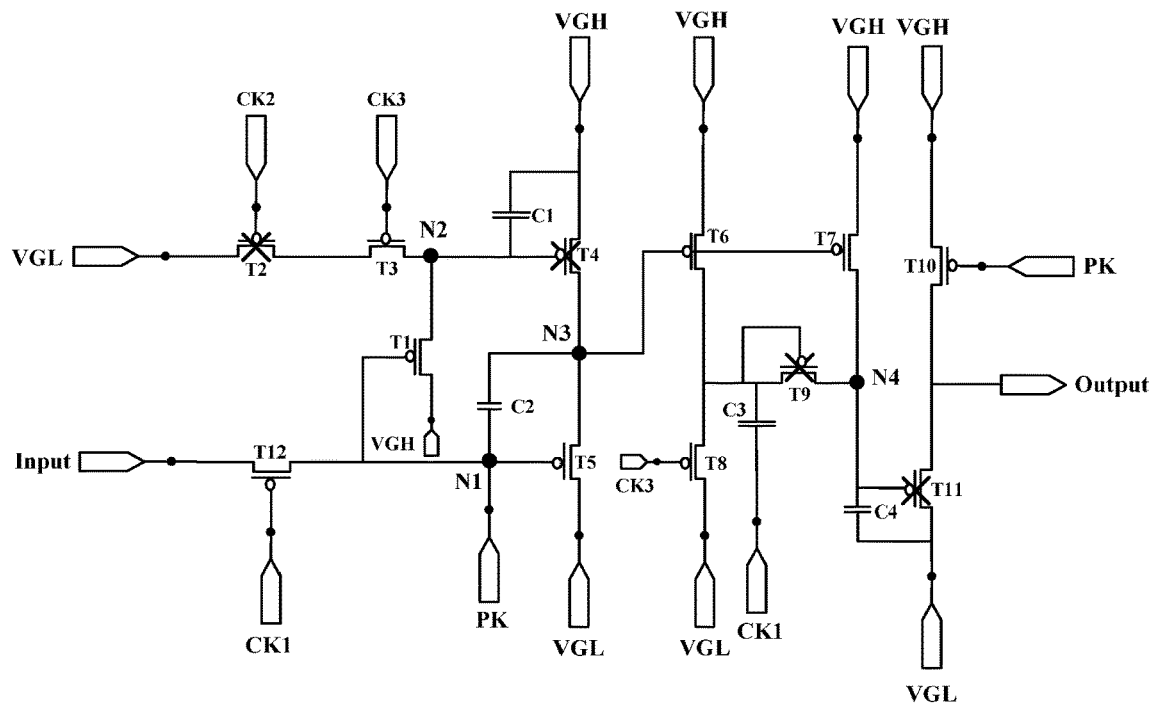
FIG. 7 is an equivalent circuit diagram of first-stage of the light emission control shift register shown in FIG. 5.

In this case, as shown in FIG. 7, a low-voltage signal is input from the first clock signal terminal CK1 to turn on the twelfth transistor T12. At this point, the low-voltage signal of the signal input terminal Input can be input to the first node N1 and the second capacitor C2 can be charged. Under the control of the first node N1, the first transistor T1 is turned on. In this case, the voltage of the first voltage terminal VGH can be transmitted to the second node N2. At this point, the signal of the second node N2 is a high-voltage signal. Under the control of the second node N2, the fourth transistor T4 is turned off. Under the control of the high-voltage signal of the second clock signal terminal CK2, the second transistor T2 is turned off. Under the control of the low-voltage signal of the third clock signal terminal CK3, the third transistor T3 is turned on.

In addition, under the control of the first node N1, the fifth transistor T5 is turned on. In this case, the voltage of the second voltage terminal VGL can be transmitted to the third node N3. At this point, the signal of the third node N3 is a low-voltage signal. Under the control of the third node N3, the sixth transistor T6 and the seventh transistor T7 are turned on. In this case, the voltage of the first voltage terminal VGH can be transmitted to the fourth node N4. At this point, the signal of the fourth node N4 is a high-voltage signal. Under the control of the high-voltage signal of the fourth node N4, the eleventh transistor T11 is turned off. In addition, under the control of the first node N1, the tenth transistor T10 is turned on. In this case, the voltage of the first voltage terminal VGH can be transmitted to the signal output terminal Output, and the signal output terminal Output outputs a high-voltage signal.

As can be seen from the above, in the first stage P1, after the high-voltage signal output from the signal output terminal Output of the EOA circuit is transmitted to the light emission control terminal EM of the pixel circuit 30, the OLED light-emitting device does not emit light. At this point, the pixel circuit 30 may be in the reset stage L1 or the data writing stage L2 as shown in FIG. 3B.

It should be noted that in order to simplify the drawing, a label "PK" is used in FIG. 7, and the two "PK" terminals represent that they have the same signal input. The same is true for other drawings, and will not be repeated later.

In the first stage P2, Input=1, Output=1, CLK1=1, CLK2=0, CLK3=1.

Figure 8:
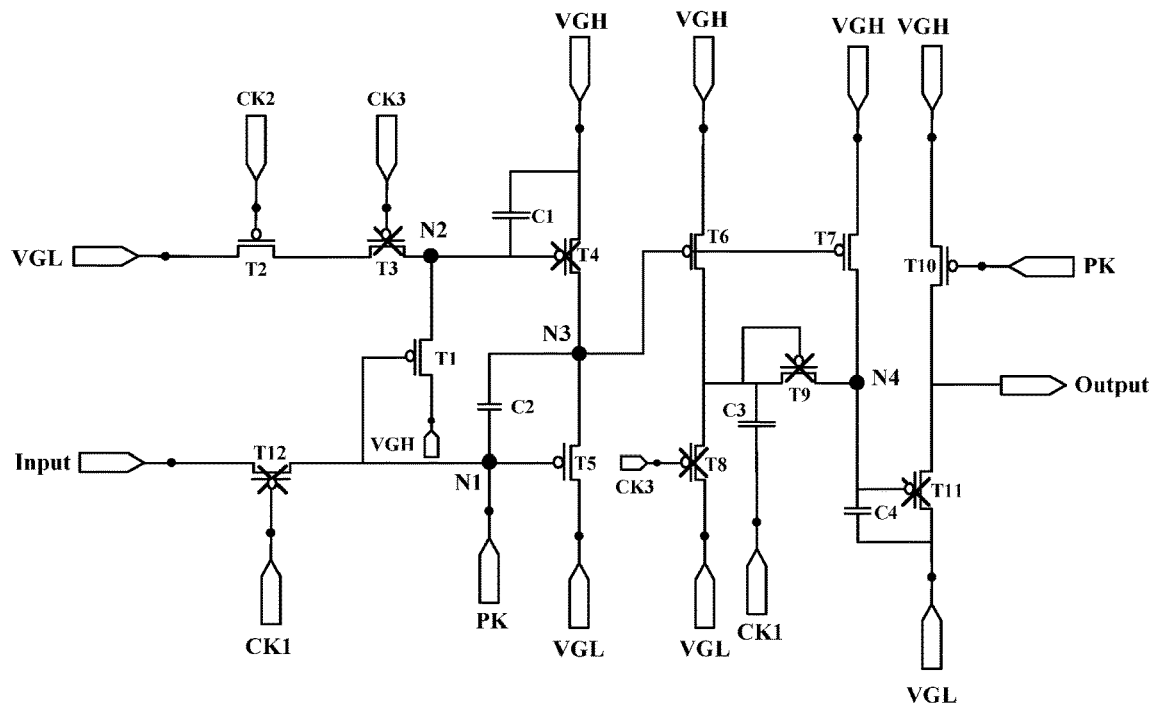
FIG. 8 is an equivalent circuit diagram of second-stage of the light emission control shift register shown in FIG. 5.

On this basis, as shown in FIG. 8, a high-voltage signal is input to the first clock signal terminal CK1 to turn off the twelfth transistor T12. At this point, the first node N1 maintains the low-voltage signal of the first stage P1. Under the control of the first node N1, the first transistor T1 is turned on. In this case, the voltage of the first voltage terminal VGH can be transmitted to the second node N2. At this point, the signal of the second node N2 is a high-voltage signal. Under the control of the second node N2, the fourth transistor T4 is turned off. In addition, under the control of the first node N1, the fifth transistor T5 is turned on. In this case, the voltage of the second voltage terminal VGL can be transmitted to the third node N3. At this point, the signal of the third node N3 is a low-voltage signal.

In addition, under the control of the third node N3, the sixth transistor T6 and the seventh transistor T7 are turned on. In this case, the voltage of the first voltage terminal VGH can be transmitted to the fourth node N4. At this point, the signal of the fourth node N4 is a high-voltage signal. Under the control of the fourth node N4, the eleventh transistor T11 is turned off. In addition, under the control of the first node N1, the tenth transistor T10 is turned on. In this case, the voltage of the first voltage terminal VGH can be transmitted to the signal output terminal Output, and the signal output terminal Output outputs a high-voltage signal.

As can be seen from the above, in the second stage P2, after the high-voltage signal output from the signal output terminal Output of the EOA circuit is transmitted to the light emission control terminal EM of the pixel circuit 30, the OLED light-emitting device does not emit light. At this point, the pixel circuit 30 may be in the reset stage L1 or the data writing stage L2 as shown in FIG. 3B.

In the third stage, Input=1, Output=1, CLK1=0, CLK2=1, CLK3=1.

Figure 9:
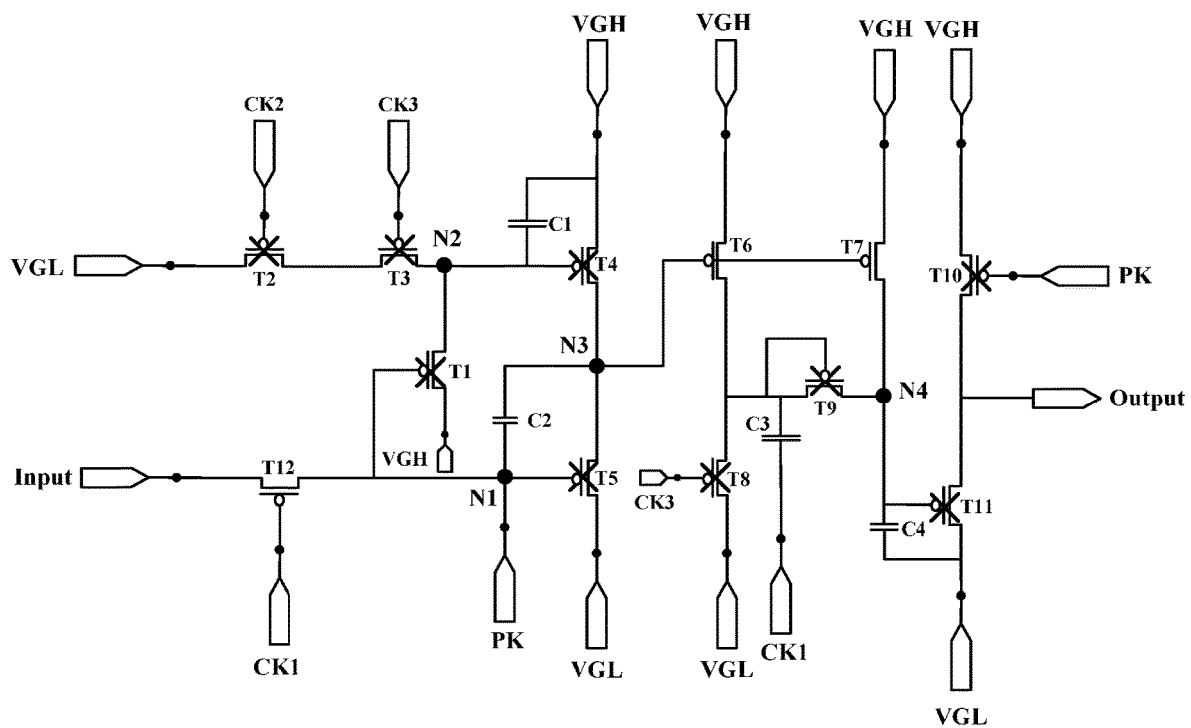
FIG. 9 is an equivalent circuit diagram of third-stage of the light emission control shift register shown in FIG. 5.

In this case, as shown in FIG. 9, a low-voltage signal is input to the first clock signal terminal CK1 to turn on the twelfth transistor T12. In this case, the high-voltage signal of the signal input terminal Input can be input to the first node N1 and the second capacitor C2 can be charged. At this point, the signal of the first node N1 is a high-voltage signal. Under the control of the first node N1, the first transistor T1 and the fifth transistor T5 are turned off. The second node N2 maintains the high-voltage signal of the second stage, and the fourth transistor T4 is turned off under the control of the second node N2. The third node N3 maintains the low-voltage signal of the second stage. Under the control of the third node N3, the sixth transistor T6 and the seventh transistor T7 are turned on. In this case, the voltage of the first voltage terminal VGH can be transmitted to the fourth node N4.

At this point, the signal of the fourth node N4 is a high-voltage signal. Under the control of the fourth node N4, the eleventh transistor T11 is turned off. Since the first node N1 has a high-voltage signal, the tenth transistor T10 is turned off. At this point, since both the tenth transistor T10 and the eleventh transistor T11 are turned off, the signal output terminal Output maintains the output of the high-voltage signal of the second stage P2.

As can be seen from the above, in the third stage P3, after the high-voltage signal output from the signal output terminal Output of the EOA circuit is transmitted to the light emission control terminal EM of the pixel circuit 30, the OLED light-emitting device does not emit light. At this point, the pixel circuit 30 is in the reset stage L1 or the data writing stage L2 as shown in FIG. 3B.

In addition, the above light emission stage may include at least a fourth stage P4, a fifth stage P5 and a sixth stage P6. As shown in FIG. 6A, in the light emission stage, the first control circuit 50 controls the signal of the second node N2 to be a low-voltage signal, the second control circuit 60 controls the signal of the third node N3 to be a high-voltage signal, and the third control circuit 70 controls the signal of the fourth node N4 to be a low-voltage signal. The fourth control circuit 80 can control the signal output terminal Output to output a low-voltage signal.

The ON-OFF conditions of the various transistors in the EOA circuit in the three stages (P4, P5 and P6) of the light emission stage will be described in detail below.

In the fourth stage P4, Input=0, CLK1=1, CLK2=0, CLK3=0, Output=0.

Figure 10:
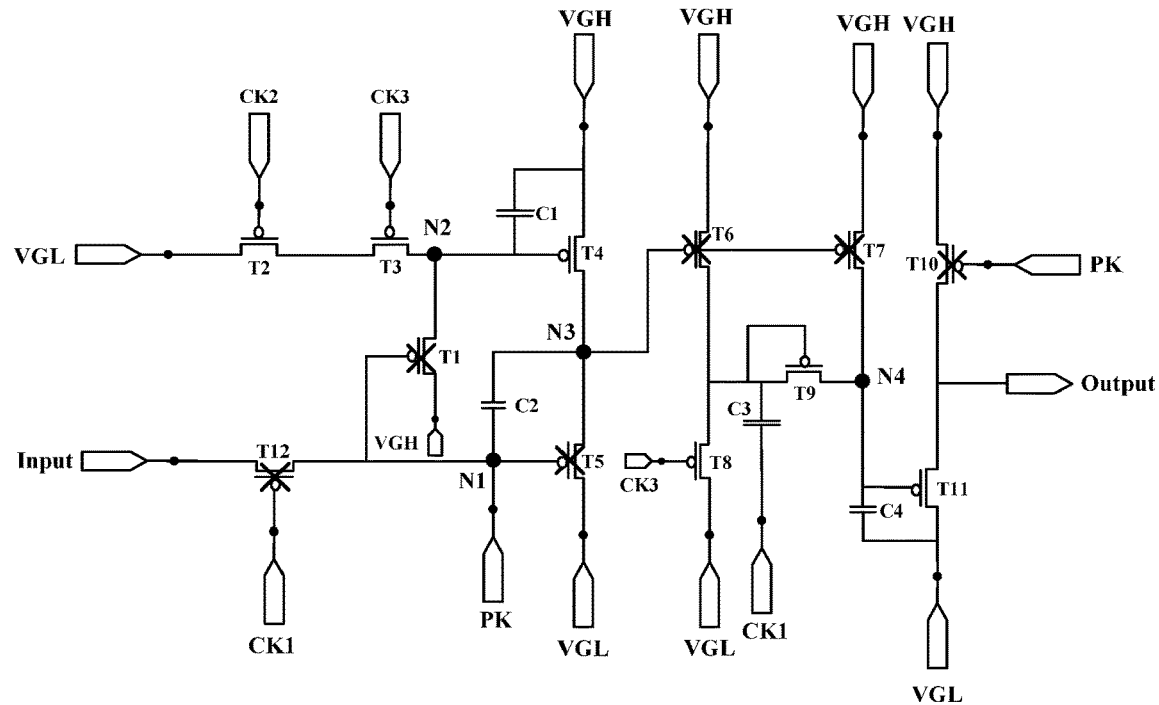
FIG. 10 is an equivalent circuit diagram of fourth-stage of the light emission control shift register shown in FIG. 5.

In this case, as shown in FIG. 10, a high-voltage signal is input to the first clock signal terminal CK1 to turn off the twelfth transistor T12. The high-voltage signal of the third stage P3 is maintained at the two electrodes of the second capacitor C, and the first node N1 still has a high-voltage signal. Under the control of the first node N1, the first transistor T1, the tenth transistor T10 and the fifth transistor T5 are turned off. Under the control of the low-voltage signal input from the second clock signal terminal CK2 and the third clock signal terminal CK3, the second transistor T2 and the third transistor T3 are turned on. In this case, the voltage of the second voltage terminal VGL can be transmitted to the second node N2, and the first capacitor C1 can be charged. At this point, the second node N2 has a low-voltage signal. Under the control of the second node N2, the fourth transistor is turned on. In this case, the voltage of the first voltage terminal VGH can be transmitted to the third node N3. At this point, the third node N3 has a high-voltage signal. Under the control of the third node N3, the sixth transistor T6 and the seventh transistor T7 are turned off. Under the control of the low-voltage signal of the third clock signal terminal CK3, the eighth transistor T8 is turned on. At this point, the second voltage terminal VGL charges the third capacitor C3. The ninth transistor T9 is turned on, and the fourth node N4 has a low-voltage signal. Under the control of the fourth node N4, the eleventh transistor T11 is turned on. In this case, the voltage of the second voltage terminal VGL can be transmitted to the signal output terminal Output. At this point, the signal output terminal Output outputs a low-voltage signal.

As can be seen from the above, in the fourth stage P4, after the low-voltage signal output by the signal output terminal Output of the EOA circuit is transmitted to the light emission control terminal EM of the pixel circuit 30, the OLED light-emitting device emits light. At this point, the pixel circuit 30 is in the light emission stage L3 as shown in FIG. 3B.

It should be noted that when N is equal to 1, that is, when the Nth image frame is the first frame, the fourth transistor can also be turned on under the common control of the first voltage terminal VGH and the gate of the fourth transistor T4.

In the fifth stage, Input=1, output=0, CLK1=0, CLK2=1, CLK3=1.

Figure 11:
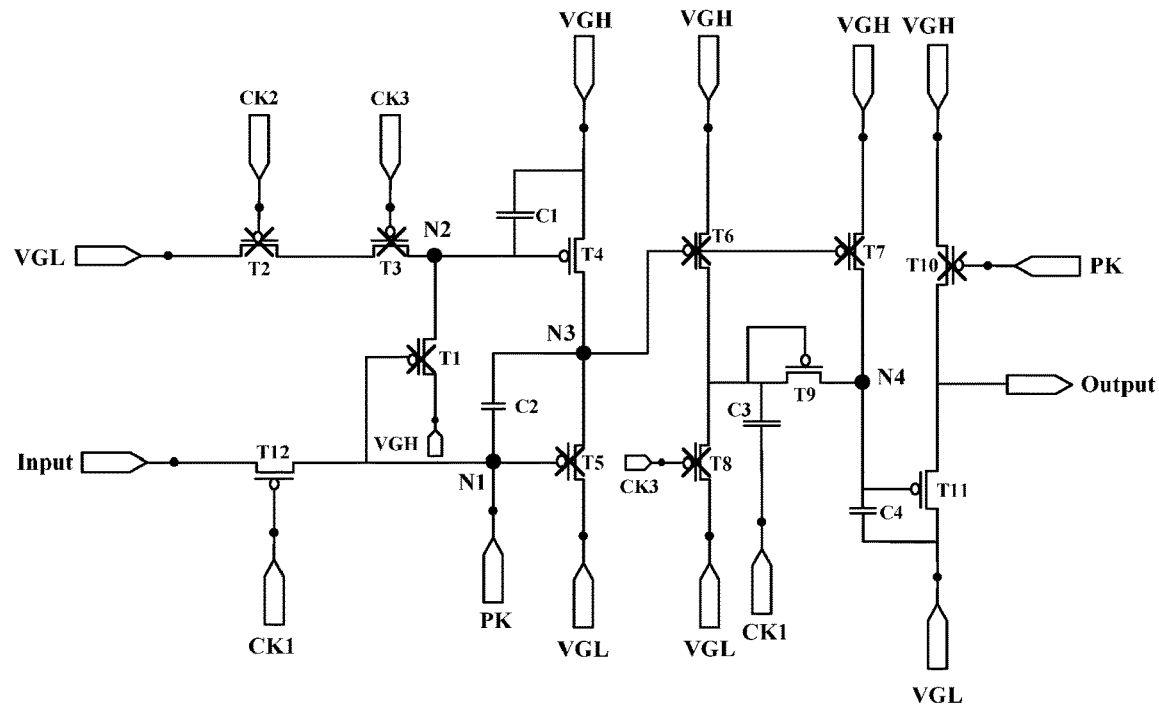
FIG. 11 is an equivalent circuit diagram of fifth-stage of the light emission control shift register shown in FIG. 5.

On this basis, as shown in FIG. 11, under the control of the low-voltage signal of the first clock signal terminal CK1, the twelfth transistor T12 is turned on. In this case, the high-voltage signal of the signal input terminal Input can be output to the first node N1, and the second capacitor C2 is charged. At this point, the first node N1 has a high-voltage signal. Under the control of the first node N1, the first transistor T1, the fifth transistor T5 and the tenth transistor T10 are turned off. The second node N2 maintains the low-voltage signal of the fourth stage P4. Under the control of the second node N2, the fourth transistor T4 is turned on. In this case, the voltage of the first voltage terminal VGH can be transmitted to the third node N3. At this point, the third node N3 has a high-voltage signal. Under the control of the third node N3, the sixth transistor T6 and the seventh transistor T7 are turned off. Under the control of the high-voltage signal of the third clock signal terminal CK3, the eighth transistor T8 is turned off. At this point, a low-voltage signal is input to the first clock signal terminal CK1. Due to the bootstrap effect of the third capacitor C3, it is equivalent to providing a low-voltage signal for the ninth transistor T9 to turn on the ninth transistor T9. At this point, the fourth node N4 has a low-voltage signal. Under the control of the fourth node N4, the eleventh transistor T11 is turned on. In this case, the voltage of the second voltage terminal VGL can be transmitted to the signal output terminal Output. At this point, the signal output terminal Output outputs a low-voltage signal.

As can be seen from the above, in the fifth stage P5, after the low-voltage signal output by the signal output terminal Output of the EOA circuit is transmitted to the light emission control terminal EM of the pixel circuit 30, the OLED light-emitting device emits light. At this point, the signal waveform input to the light emission control terminal EM of the pixel circuit 30 is similar to that in the fourth stage.

In the sixth stage, Input=1, Output=0, CLK1=1, CLK2=0, CLK3=1.

On this basis, as shown in FIG. 12, under the control of the high-voltage signal of the first clock signal terminal CK1, the twelfth transistor T12 is turned off, and the first node N1 maintains the high-voltage signal of the fifth stage P5. Under the control of the first node N1, the first transistor T1, the fifth transistor T5, and the tenth transistor T10 are turned off. Under the control of the high-voltage signal of the third clock signal terminal CK3, the third transistor T3 is turned off, and the second node N2 maintains the low-voltage signal of the fifth stage P5. Under the control of the second node N2, the fourth transistor T4 is turned on. In this case, the voltage of the first voltage terminal VGH can be transmitted to the third node N3.

At this point, the third node N3 has a high-voltage signal. Under the control of the third node N3, both the sixth transistor T6 and the seventh transistor T7 are turned off. Under the control of the high-voltage signals of the first clock signal terminal CK1 and the third clock signal terminal CK3, the eighth transistor T8 and the ninth transistor T9 are turned off. At this point, the fourth node N4 maintains the low-voltage signal of the fifth stage P5. Under the control of the fourth node N4, the eleventh transistor T11 is turned on. In this case, the voltage of the second voltage terminal VGL can be transmitted to the signal output terminal Output. At this point, the signal output terminal Output outputs a low-voltage signal.

As can be seen from the above, in the sixth stage P6, after the low-voltage signal output by the signal output terminal Output of the EOA circuit is transmitted to the light emission control terminal EM of the pixel circuit 30, the OLED light-emitting device emits light. At this point, the signal waveform input to the light emission control terminal EM of the pixel circuit 30 is similar to that in the fourth stage.

The number of specific stages of the light emission stage is not specifically limited in the embodiment of the present disclosure. In the embodiment of the present disclosure, the light emission stage includes at least the above three stages (P4 to P6). It should be noted that the above three stages (P4 to P6) are only an example, and other light emission stages can have timing waveform patterns repeating that of the above P4 to P6 stages.

In addition, as shown in FIG. 6A, the (N−1)th frame may include a seventh stage P7, an eighth stage P8, and a ninth stage P9. Wherein, the timing waveforms corresponding to the seventh stage P7, the eighth stage P8 and the ninth stage P9 in FIG. 6A are the same as those in the above P4 to P6 stages respectively.

It should be noted that in some embodiments of the present disclosure, when N is 1, that is, when the display screen is the first frame image, the low-voltage signal of the Input terminal in the first stage P1 as shown in FIG. 6A can be directly input as the start signal terminal GSTV of the first-level EOA shift register E0. In addition, other stages in the first frame image are similar to that described above.

Alternatively, in some embodiments of the present disclosure, when N is 1, that is, when the display screen is the first frame image, the high-voltage signal of the Input terminal in the seventh stage P7 in 0th frame as shown in FIG. 6A can be input as the start signal terminal GSTV of the first gate driving circuit 11. At this point, when the high-voltage signal of the Input terminal in the seventh stage P7 is input as the start signal terminal GSTV, the Dummy EOA (for example, E0 in FIG. 2) and Dummy GOA (for example, G0 in FIG. 2) in the gate driving circuit 10 can be used to pull down the output voltage of the Output terminal at 25 u-50 u in the effect simulation diagram shown in FIG. 6B to an active voltage. In this way, it is ensured that the subsequent low voltage output by the signal output terminal Output can be stable and achieve the light emission effect.

It should be noted that the light emission signal EM and the gating signal output by the signal output terminals Output of the above dummy EOA and dummy GOA are not electrically connected to the pixel circuit 30, that is, the light emission signal EM and the gating signal output by the signal output terminals Output of the dummy EOA and the dummy GOA are not used to drive the light-emitting device L to emit light. Therefore, when N is 1 and the high-voltage signal of the Input terminal in the seventh stage P7 is input as the start signal terminal GSTV of the EOA, the display device 100 does not emit light even when the signal output terminal Output outputs a low-voltage signal. In addition, the number of dummy EOA and dummy GOA is not limited in the present disclosure.

It should be noted that the working process of the EOA register in the next image frame is the same as that of the EOA register in the image frame of the above embodiment.

To sum up, in the non-light emission stages (P1 to P3) of one frame image, the signal output terminal Output of EOA circuit outputs a high-voltage signal. When the high-voltage signal is transmitted to pixel circuit 30, the OLED light-emitting device does not emit light. Correspondingly, the pixel circuit 30 may be in the reset stage L1 or the data writing stage L2 as shown in FIG. 3B. In the light emission stages (P4 to P5) of one frame image, the signal output terminal Output of the EOA circuit outputs a low-voltage signal. When the low-voltage signal is transmitted to the pixel circuit 30, the light-emitting device L can emit light. At this point, the pixel circuit 30 is in the light emission stage L3 shown in FIG. 3B or other stages having the same waveforms as the light emission stage L3. In this way, through the above EOA circuit and the corresponding driving method, an active light emission signal EM can be provided to the pixel circuit 30 in the light emission stages P4 to P6, so that the pixel circuit 30 outputs a driving current to the light-emitting device L electrically connected to the pixel circuit 30 to drive the light-emitting device L to emit light.

The disclosed above are only several specific embodiments of the present disclosure, however, the protection scope of the present disclosure is not limited to this. Any variation or replacement easily conceivable by those skilled in the art within the technical scope disclosed in the present disclosure shall fall within the protection scope of the present disclosure. Therefore, the protection scope of the present disclosure shall be determined by the terms of the claims.

What is claimed is:

1. A light emission control shift register, comprising:
    an input circuit electrically connected to a signal input terminal, a first clock signal terminal and a first node; wherein the input circuit is configured to output a signal of the signal input terminal to the first node under the control of a signal from the first clock signal terminal;
    a first control circuit electrically connected to the first node, a second clock signal terminal, a third clock signal terminal, a first voltage terminal, a second voltage terminal and a second node; wherein the first control circuit is configured to output a voltage of the first voltage terminal to the second node under the control of a signal from the first node; the first control circuit is further configured to transmit a voltage of the second voltage terminal to the second node under the control of signals from the second clock signal terminal and the third clock signal terminal;
    a second control circuit electrically connected to the first node, the second node, a third node, the first voltage terminal and the second voltage terminal; wherein the second control circuit is configured to transmit the voltage of the first voltage terminal to the third node under the control of a signal from the second node and the first voltage terminal; the second control circuit is further configured to transmit the voltage of the second voltage terminal to the third node under the control of the signal from the first node;
    a third control circuit electrically connected to the third node, a fourth node, the first voltage terminal, the second voltage terminal, the first clock signal terminal and the third clock signal terminal; wherein the third control circuit is configured to transmit the voltage of the first voltage terminal to the fourth node under the control of a signal from the third node; the third control circuit is further configured to transmit the voltage of the second voltage terminal to the fourth node under the control of the signals from the first clock signal terminal and the third clock signal terminal;
    a fourth control circuit electrically connected to the fourth node, the first node, the first voltage terminal, the second voltage terminal and a signal output terminal; wherein the fourth control circuit is configured to transmit the voltage of the first voltage terminal to the signal output terminal under the control of the signal from the first node; the fourth control circuit is further configured to transmit the voltage of the second voltage terminal to the signal output terminal under the control of a signal from the fourth node.

2. The light emission control shift register according to claim 1, wherein the first control circuit comprises:
a first pull-up circuit electrically connected to the first node, the second node and the first voltage terminal; wherein the first pull-up circuit is configured to transmit the voltage of the first voltage terminal to the second node under the control of the signal from the first node;
a first pull-down circuit electrically connected to the second clock signal terminal, the third clock signal terminal, the second voltage terminal and the second node; wherein the first pull-down circuit is configured to transmit the voltage of the second voltage terminal to the second node under the control of signals from the second clock signal terminal and the third clock signal terminal.

3. The light emission control shift register according to claim 2, wherein the first pull-up circuit comprises:
a first transistor, a first electrode of the first transistor being electrically connected to the first voltage terminal, a second electrode of the first transistor being electrically connected to the second node, and a gate of the first transistor being electrically connected to the first node.

4. The light emission control shift register according to claim 2, wherein
the first pull-down circuit comprises:
a first transistor, a first electrode of the first transistor being electrically connected to the second voltage terminal, and a gate of the first transistor being electrically connected to the second clock signal terminal;
a second transistor, a first electrode of the second transistor being electrically connected to a second electrode of the first transistor, a second electrode of the second transistor being electrically connected to the second node, and a gate of the second transistor being electrically connected to the third clock signal terminal.

5. The light emission control shift register according to claim 1, wherein the second control circuit comprises:
a second pull-up circuit electrically connected to the second node, the third node and the first voltage terminal; wherein the second pull-up circuit is configured to transmit the voltage of the first voltage terminal to the third node under the control of a signal from the second node and the first voltage terminal;
a second pull-down circuit electrically connected to the first node, the third node and the second voltage terminal; wherein the second pull-down circuit is configured to transmit the voltage of the second voltage terminal to the third node under the control of a signal from the first node.

6. The light emission control shift register according to claim 5, wherein the second pull-up circuit comprises:
a first transistor, a first electrode of the first transistor being electrically connected to the first voltage terminal, a second electrode of the first transistor being electrically connected to the third node, and a gate of the first transistor being electrically connected to the second node;
a first capacitor, a first electrode of the first capacitor being electrically connected to the first voltage terminal, and a second electrode of the first capacitor being electrically connected to the second node.

7. The light emission control shift register according to claim 5, wherein
the second pull-down circuit comprises:
a first transistor, a first electrode of the first transistor being electrically connected to the second voltage terminal, a second electrode of the first transistor being electrically connected to the third node, and a gate of the first transistor being electrically connected to the first node;
a second capacitor, a first electrode of the second capacitor being electrically connected to the first node, and a second electrode of the second capacitor being electrically connected to the third node.

8. The light emission control shift register according to claim 1, wherein the third control circuit comprises:
a first pull-up circuit electrically connected to the third node, the fourth node and the first voltage terminal; wherein the first pull-up circuit is configured to transmit the voltage of the first voltage terminal to the fourth node under the control of a signal from the third node;
a first pull-down circuit electrically connected to the fourth node, the second voltage terminal, the first clock signal terminal and the third clock signal terminal; wherein the first pull-down circuit is configured to transmit the voltage of the second voltage terminal to the fourth node under the control of the signals from the first clock signal terminal and the third clock signal terminal.

9. The light emission control shift register according to claim 8, wherein the first pull-up circuit comprises:
a first transistor, a first electrode of the first transistor being electrically connected to the first voltage terminal, and a gate of the first transistor being electrically connected to the third node;
a second transistor, a first electrode of the second transistor being electrically connected to the first voltage terminal, a second electrode of the second transistor being electrically connected to the fourth node, and a gate of the second transistor being electrically connected to the third node.

10. The light emission control shift register according to claim 9, wherein
the first pull-down circuit comprises:
a third transistor, a first electrode of the third transistor being electrically connected to the second voltage terminal, a second electrode of the third transistor being electrically connected to the second electrode of the first transistor, and a gate of the third transistor being electrically connected to the third clock signal terminal;
a fourth transistor, a first electrode of the fourth transistor being electrically connected to the second electrode of the third transistor, and a second electrode of the fourth transistor being electrically connected to the fourth node;
a first capacitor, a first electrode of the first capacitor being electrically connected to a gate of the fourth transistor and the first electrode of the fourth transistor, and a second electrode of the first capacitor being electrically connected to the first clock signal terminal.

11. The light emission control shift register according to claim 1, wherein the fourth control circuit comprises:
a first pull-up circuit electrically connected to the first node, the first voltage terminal and the signal output terminal; wherein the first pull-up circuit is configured to transmit the voltage of the first voltage terminal to the signal output terminal under the control of the signal from the first node;

a first pull-down circuit electrically connected to the fourth node, the second voltage terminal and the signal output terminal; wherein the first pull-down circuit is configured to transmit the voltage of the second voltage terminal to the signal output terminal under the control of the signal from the fourth node.

12. The light emission control shift register according to claim 11, wherein the first pull-up circuit comprises:
a first transistor, a first electrode of the first transistor being electrically connected to the first voltage terminal, a second electrode of the first transistor being electrically connected to the signal output terminal, and a gate of the first transistor being electrically connected to the first node.

13. The light emission control shift register according to claim 11, wherein
the first pull-down circuit comprises:
a first transistor, a first electrode of the first transistor being electrically connected to the second voltage terminal, a second electrode of the first transistor being electrically connected to the signal output terminal, and a gate of the first transistor being electrically connected to the fourth node;
a first capacitor, a first electrode of the first capacitor being electrically connected to the fourth node, and a second electrode of the first capacitor being electrically connected to the second voltage terminal.

14. The light emission control shift register according to claim 1, wherein the input circuit comprises:
a first transistor, a first electrode of the first transistor being electrically connected to the signal input terminal, a second electrode of the first transistor being electrically connected to the first node, and a gate of the first transistor being electrically connected to the first clock signal terminal.

15. A gate driving circuit comprising a plurality of light emission control shift registers according to claim 1.

16. A display device, comprising:
a plurality of pixel circuits arranged in an array; wherein the pixel circuit has a light emission control terminal and a gating signal terminal;
a first gate driving circuit that is the gate driving circuit according to claim 15; wherein the signal output terminal of each light emission control shift register in the first gate driving circuit is electrically connected to the light emission control terminals of pixel circuits located in the same row;
a second gate driving circuit comprising a plurality of cascaded gating control shift registers, wherein an output terminal of each gating control shift register is electrically connected to gating signal terminals of pixel circuits located in the same row.

17. The display device according to claim 16, wherein the display device further comprises a first system clock signal line and a second system clock signal line;
the gating control shift register further comprises a first gating clock signal terminal and a second gating clock signal terminal;
the first gating clock signal terminal and the first clock signal terminal of the light emission control shift register are both electrically connected to the first system clock signal line;
the second gating clock signal terminal and the second clock signal terminal of the light emission control shift register are both electrically connected to the second system clock signal line;
a signal input terminal of a first-level gating control shift register and a signal input terminal of a first-level light emission control shift register are both electrically connected to a start signal terminal.

18. A method for driving the light emission control shift register according to claim 1, wherein a time period for displaying a frame of image includes a non-light emission stage and a light emission stage; and within the time period, the method comprises:
in the non-light emission stage, controlling, by the first control circuit, the signal of the second node to be an inactive signal, controlling, by the second control circuit, the signal of the third node to be an active signal, and controlling, by the third control circuit, the signal of the fourth node to be the inactive signal; controlling, by the fourth control circuit, the signal output terminal to output the inactive signal;
in the light emission stage, controlling, by the first control circuit, the signal of the second node to be the active signal, controlling, by the second control circuit, the signal of the third node to be the inactive signal, and controlling, by the third control circuit, the signal of the fourth node to be the active signal; controlling, by the fourth control circuit, the signal output terminal to output the active signal;
wherein the active signal is a signal that turns on a transistor when being electrically connected to a gate of the transistor, the inactive signal is a signal that turns off the transistor when being electrically connected to the gate of the transistor, the signal at the first voltage terminal being the inactive signal, and the signal at the second voltage terminal being the active signal.

19. The method according to claim 18, wherein the non-light emission stage comprises a first stage, a second stage and a third stage,
wherein, in the first stage, the input circuit outputs the active signal of the signal input terminal to the first node under the control of the active signal from the first clock signal terminal; the first control circuit transmits the voltage of the first voltage terminal to the second node under the control of the signal from the first node; the second control circuit transmits the voltage of the second voltage terminal to the third node under the control of the signals from the first node and the second node; the third control circuit transmits the voltage of the first voltage terminal to the fourth node under the control of the signal from the third node; the fourth control circuit transmits the voltage of the first voltage terminal to the signal output terminal under the control of the signals from the fourth node and the first node, wherein the signal output terminal outputs the inactive signal;
in the second stage, the first node maintains the active signal of the first stage; the first control circuit transmits the voltage of the first voltage terminal to the second node under the control of the signal from the first node; the second control circuit transmits the voltage of the second voltage terminal to the third node under the control of the signals from the first node and the second node; the third control circuit transmits the voltage of the first voltage terminal to the fourth node under the control of the signal from the third node; the fourth control circuit transmits the voltage of the first voltage terminal to the signal output terminal under the control of the signals from the fourth node and the first node, wherein the signal output terminal outputs the inactive signal;

in the third stage, the input circuit outputs the inactive signal of the signal input terminal to the first node under the control of the active signal from the first clock signal terminal; the second node maintains the inactive signal of the second stage; the third node maintains the active signal of the second stage; the third control circuit transmits the voltage of the first voltage terminal to the fourth node under the control of the signal from the third node; the signal output terminal maintains the inactive signal of the second stage.

20. The method according to claim 18, wherein the light emission stage comprises a first stage, a second stage and a third stage, wherein, in the first stage, the signal of the first node is an inactive signal supplied by the signal input terminal; the first control circuit transmits an active voltage of the second voltage terminal to the second node under the control of active signals from the second clock signal terminal and the third clock signal terminal; the second control circuit transmits the voltage of the first voltage terminal to the third node under the control of the signal from the second node or the first voltage terminal; the third control circuit transmits the voltage of the second voltage terminal to the fourth node under the control of the inactive signal from the first clock signal terminal and the active signal from the third clock signal terminal; the fourth control circuit transmits the voltage of the second voltage terminal to the signal output terminal under the control of the signal from the fourth node; wherein the signal output terminal outputs the active signal;

in the second stage, the input circuit outputs the inactive signal of the signal input terminal to the first node under the control of the active signal from the first clock signal terminal; the second node maintains the active signal of the first stage; the second control circuit transmits the voltage of the first voltage terminal to the third node under the control of the signal from the second node; the third control circuit transmits the voltage of the second voltage terminal to the fourth node under the control of the active signal from the first clock signal terminal and the inactive signal from the third clock signal terminal; the fourth control circuit transmits the voltage of the second voltage terminal to the signal output terminal under the control of the signal from the fourth node; wherein the signal output terminal outputs the active signal;

in the third stage, the first node maintains the inactive signal of the second stage; the second node maintains the active signal of the second stage; the second control circuit transmits the voltage of the first voltage terminal to the third node under the control of the signal from the second node; the fourth node maintains the active signal of the second stage; the fourth control circuit transmits the active voltage of the second voltage terminal to the signal output terminal under the control of the signal from the fourth node; the signal output terminal outputs the active signal.

* * * * *